United States Patent
Hwang et al.

(10) Patent No.: US 10,134,583 B2
(45) Date of Patent: Nov. 20, 2018

(54) METHODS OF FORMING A LOW-K DIELECTRIC LAYER AND METHODS OF FABRICATING A SEMICONDUCTOR DEVICE USING THE SAME

(71) Applicant: Samsung Electronics Co., Ltd., Suwon-si, Gyeonggi-do (KR)

(72) Inventors: Sunhye Hwang, Hwaseong-si (KR); Myong Woon Kim, Daejeon (KR); Younjoung Cho, Hwaseong-si (KR); Sang Ick Lee, Daejeon (KR); Sang Yong Jeon, Sejong (KR); In Kyung Jung, Daejeon (KR); Wonwoong Chung, Suwon-si (KR); Jungsik Choi, Seongnam-si (KR)

(73) Assignees: Samsung Electronics Co., Ltd., Gyeonggi-Do (KR); DNF Co., Ltd., Daejeon (KR)

( * ) Notice: Subject to any disclaimer, the term of this patent is extended or adjusted under 35 U.S.C. 154(b) by 0 days.

(21) Appl. No.: 15/349,359

(22) Filed: Nov. 11, 2016

(65) Prior Publication Data
US 2017/0207083 A1 Jul. 20, 2017

(30) Foreign Application Priority Data
Jan. 19, 2016 (KR) .................. 10-2016-0006647

(51) Int. Cl.
*H01L 21/02* (2006.01)
*H01L 21/768* (2006.01)
(Continued)

(52) U.S. Cl.
CPC ...... *H01L 21/02208* (2013.01); *C01B 33/126* (2013.01); *H01L 21/02123* (2013.01);
(Continued)

(58) Field of Classification Search
CPC .. C08J 9/26; C08L 83/04; C08L 83/14; H01L 21/02126; H01L 21/02203; H01L 21/02216; H01L 21/02282; H01L 21/3121; H01L 21/31695; H01L 21/318; H01L 21/7682; C08G 77/045; C08G 77/12; C08G 77/70
See application file for complete search history.

(56) References Cited

U.S. PATENT DOCUMENTS 6,541,367 B1  4/2003  Mandal
6,583,048 B1  6/2003  Vincent et al.
(Continued)

OTHER PUBLICATIONS

Uozumi, et al. "Asymmetric Functionalization of Bicycloalkenes by Catalytic Enantioposition-Selective Hydrosilylation," Tetrahedron Letters, vol. 33, No. 47, pp. 7185-7188 (1992).
(Continued)

*Primary Examiner* — Brian Turner
(74) *Attorney, Agent, or Firm* — Harness, Dickey & Pierce, P.L.C.

(57) ABSTRACT

A method of forming a dielectric layer includes forming a preliminary dielectric layer on a substrate using a silicon precursor and performing an energy treatment on the preliminary dielectric layer to form a dielectric layer. In the dielectric layer, a ratio of Si—CH$_3$ bonding unit to Si—O bonding unit ranges from 0.5 to 5.

20 Claims, 10 Drawing Sheets

(51) Int. Cl.
*H01L 21/31* (2006.01)
*H01L 23/48* (2006.01)
*C23C 16/40* (2006.01)
*H01L 23/532* (2006.01)
*C23C 16/56* (2006.01)
*C01B 33/12* (2006.01)

(52) U.S. Cl.
CPC .. *H01L 21/02203* (2013.01); *H01L 21/76802* (2013.01); *H01L 21/76843* (2013.01); *H01L 21/76877* (2013.01)

(56) References Cited

U.S. PATENT DOCUMENTS

| | | | |
|---|---|---|---|
| 6,653,719 B2 | 11/2003 | Matsuki | |
| 6,743,471 B2 | 6/2004 | Ko et al. | |
| 6,825,130 B2 | 11/2004 | Todd | |
| 7,229,934 B2 | 6/2007 | Dubois et al. | |
| 7,282,458 B2 | 10/2007 | Gates et al. | |
| 7,384,471 B2 | 6/2008 | Vrtis et al. | |
| 7,842,518 B2 | 11/2010 | Miyajima | |
| 7,915,180 B2 | 3/2011 | Gates et al. | |
| 7,943,195 B2 | 5/2011 | Vrtis et al. | |
| 7,968,471 B2 | 6/2011 | Harada et al. | |
| 7,989,033 B2 | 8/2011 | Yim et al. | |
| 8,137,764 B2 | 3/2012 | Vincent et al. | |
| 8,293,001 B2 | 10/2012 | Vrtis et al. | |
| 8,932,674 B2 | 1/2015 | Dussarrat et al. | |
| 9,018,107 B2 | 4/2015 | Haas et al. | |
| 2005/0227502 A1 | 10/2005 | Schmitt et al. | |
| 2006/0069171 A1* | 3/2006 | Prokopowicz | C08J 9/26 521/61 |
| 2006/0189133 A1* | 8/2006 | Dimitrakopoulos | H01L 21/76825 438/687 |
| 2006/0247404 A1* | 11/2006 | Todd | C09D 4/00 528/10 |
| 2007/0196639 A1* | 8/2007 | Gates | H01L 21/02126 428/315.7 |
| 2011/0070543 A1* | 3/2011 | Knapp | C08F 232/08 430/280.1 |
| 2012/0178253 A1* | 7/2012 | Ahn | C23C 16/401 438/643 |
| 2013/0175680 A1 | 7/2013 | Gates et al. | |
| 2014/0004717 A1* | 1/2014 | Chan | C23C 16/045 438/798 |
| 2015/0279667 A1* | 10/2015 | Canaperi | H01L 21/02348 106/122 |

OTHER PUBLICATIONS

Hayashi, et al. "Optically Active Cyclic Allylsilanes Preparation by Asymetric Hydrosilyation and Anti Stereochemistry in SE' Reactions1," Tetrahedron Letters, vol. 24, No. 50, pp. 5661-5664 (1983).
Hayashi, et al. "Catalytic Asymmetric Hydrosilylation of 1, 3-Dienes with New Chiral Ferrocenylphosphine-Palladium Complexes," Tetrahedron: Asymmetry, vol. 1, No. 3, pp. 151-154 (1990).
Hayashi, T. Hydrosilylation of Carbon-Carbon Double Bonds. In Comprehensive Asymmetric Catalysis; Jacobsen, E. N., Pfaltz, A., Yamamoto, H., Eds.; Springer: Berlin, 1999; pp. 319-333.

\* cited by examiner

METHODS OF FORMING A LOW-K DIELECTRIC LAYER AND METHODS OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2016-0006647, filed on Jan. 19, 2016, in the Korean Intellectual Property Office, the entire contents of which are hereby incorporated by reference.

BACKGROUND

1. Field

Some example embodiments of the present disclosure relate to a semiconductor device and a method of fabricating the same, and in particular, to a method of forming a low-k dielectric layer using a silicon precursor and a method of fabricating a semiconductor device using the method.

2. Description of the Related Art

Due to their relatively small-size, multifunctionality, and/or relatively low-cost characteristics, semiconductor devices are important elements in the electronic industry. In general, the semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is necessary to reduce a process margin (for example, in a photolithography process). Although much research has been conducted to overcome such difficulties, the reduction of the process margin leads to several difficulties in fabricating a semiconductor device.

SUMMARY

Some example embodiments of the inventive concepts provide a method of forming a low-k dielectric layer with a relatively low dielectric constant and a relatively high mechanical strength.

Some example embodiments of the inventive concepts provide a method of fabricating a semiconductor device which is configured to allow interconnection lines thereof to have a relatively low parasitic capacitance.

According to some example embodiments of the inventive concepts, a method of forming a dielectric layer includes forming a preliminary dielectric layer on a substrate using a silicon precursor containing a compound represented by the following Chemical Formula 1, and performing an energy treatment on the preliminary dielectric layer to form the dielectric layer. In the dielectric layer, a ratio of a Si—CH$_3$ bonding unit to a Si—O bonding unit ranges from 0.5 to 5.

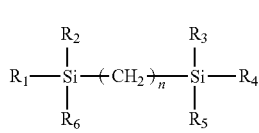

[Chemical Formula 1]

wherein, in the Chemical Formula 1, n is 1 or 2, at least two of $R_1$, $R_2$, $R_3$, $R_5$, and $R_6$ are —O—$R_7$ and the others are each independently one of hydrogen, ($C_1$-$C_{10}$)alkyl, ($C_3$-$C_{10}$)alkenyl, ($C_3$-$C_{10}$)alkynyl, and ($C_1$-$C_{10}$)alkoxy, $R_7$ is one of hydrogen, ($C_1$-$C_{10}$)alkyl, ($C_3$-$C_{10}$)alkenyl, and ($C_3$-$C_{10}$)alkynyl, and $R_4$ is a porogen group including one of ($C_3$-$C_{10}$)alkenyl, ($C_3$-$C_{10}$)alkynyl, ($C_3$-$C_{10}$)aryl, ($C_3$-$C_{10}$)heteroaryl, ($C_3$-$C_{10}$)cycloalkyl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, and ($C_3$-$C_{10}$)heterocycloalkyl($C_1$-$C_{10}$)alkyl.

According to some example embodiments of the inventive concepts, a method of forming a dielectric layer includes forming the dielectric layer on a substrate using a silicon precursor containing a compound represented by the following Chemical Formula 1,

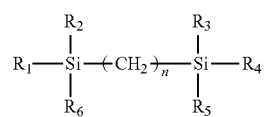

[Chemical Formula 1]

wherein, in the Chemical Formula 1, n is 1 or 2, at least two of $R_1$, $R_2$, $R_3$, $R_5$, and $R_6$ are —O—$R_7$ and the others are each independently one of hydrogen, ($C_1$-$C_{10}$)alkyl, ($C_3$-$C_{10}$)alkenyl, ($C_3$-$C_{10}$)alkynyl, and ($C_1$-$C_{10}$)alkoxy, $R_7$ is one of hydrogen, ($C_1$-$C_{10}$)alkyl, ($C_3$-$C_{10}$)alkenyl, and ($C_3$-$C_{10}$)alkynyl, and $R_4$ is a porogen group including one of ($C_3$-$C_{10}$)aryl, ($C_3$-$C_{10}$)heteroaryl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, and ($C_3$-$C_{10}$)heterocycloalkyl($C_1$-$C_{10}$)alkyl.

According to some example embodiments of the inventive concepts, a method of forming a dielectric layer includes forming a preliminary dielectric layer on a substrate using a silicon precursor containing a compound represented by the following Chemical Formula 1, and performing an energy treatment on the preliminary dielectric layer to form the dielectric layer. The dielectric layer has a Young's modulus ranging from 6 GPa to 15 GPa.

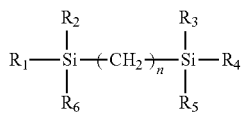

[Chemical Formula 1]

wherein, in the Chemical Formula 1, n is 1 or 2, at least three of $R_1$, $R_2$, $R_3$, $R_5$, and $R_6$ are methoxy and the others are each independently one of hydrogen, ($C_1$-$C_{10}$)alkyl, ($C_3$-$C_{10}$)alkenyl, ($C_3$-$C_{10}$)alkynyl, and ($C_1$-$C_{10}$)alkoxy, and $R_4$ is a porogen group including one of ($C_3$-$C_{10}$)alkenyl, ($C_3$-$C_{10}$)alkynyl, ($C_3$-$C_{10}$)aryl, ($C_3$-$C_{10}$)heteroaryl, ($C_3$-$C_{10}$)cycloalkyl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, and ($C_3$-$C_{10}$)heterocycloalkyl($C_1$-$C_{10}$)alkyl.

According to some example embodiments of the inventive concepts, a method of fabricating a semiconductor device includes forming a silicon insulating layer on a substrate using a silicon precursor, the silicon precursor including a molecule having a structure of Si—(CH$_2$)n-Si, and forming at least one interconnection line in the silicon insulating layer. Here, n is 1 or 2, the silicon precursor contains a porogen group configured to combine with at least one of the Si atoms in the molecule, and at least two ($C_1$-$C_5$)alkoxy groups configured to combine with the Si atoms in the molecule. The porogen group includes one of ($C_3$-$C_{10}$)alkenyl, ($C_3$-$C_{10}$)alkynyl, ($C_3$-$C_{10}$)aryl, ($C_3$-$C_{10}$)heteroaryl, ($C_3$-$C_{10}$)cycloalkyl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, and ($C_3$-$C_{10}$)heterocycloalkyl($C_1$-$C_{10}$)alkyl.

According to some example embodiments of the inventive concepts, a method includes forming a dielectric layer using a silicon precursor containing a compound represented by the following Chemical Formula 1:

[Chemical Formula 1]

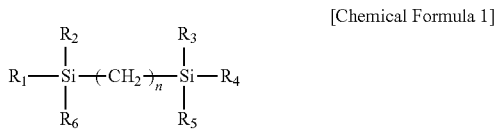

wherein, in the Chemical Formula 1, n is 1 or 2, at least three of $R_1$, $R_2$, $R_3$, $R_5$, and $R_6$ are methoxy and the others are each independently one of hydrogen, ($C_1$-$C_{10}$)alkyl, ($C_3$-$C_{10}$)alkenyl, ($C_3$-$C_{10}$)alkynyl, and ($C_1$-$C_{10}$)alkoxy, and $R_4$ is one of ($C_3$-$C_{10}$)alkenyl, ($C_3$-$C_{10}$)alkynyl, ($C_3$-$C_{10}$)aryl, ($C_3$-$C_{10}$)heteroaryl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, and ($C_3$-$C_{10}$)heterocycloalkyl($C_1$-$C_{10}$) alkyl.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1A:
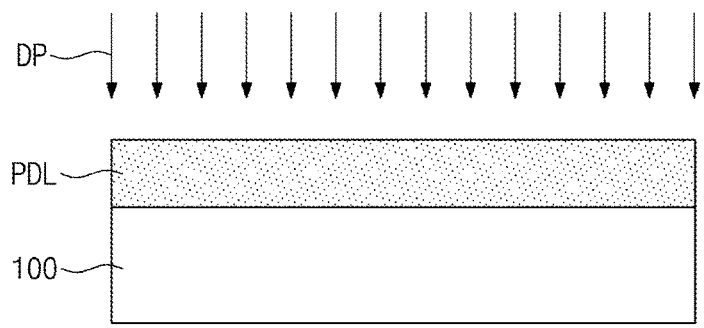
FIGS. 1A and 2 are sectional views illustrating a method of forming a low-k dielectric layer, according to example embodiments of the inventive concepts.
Figure 1B:
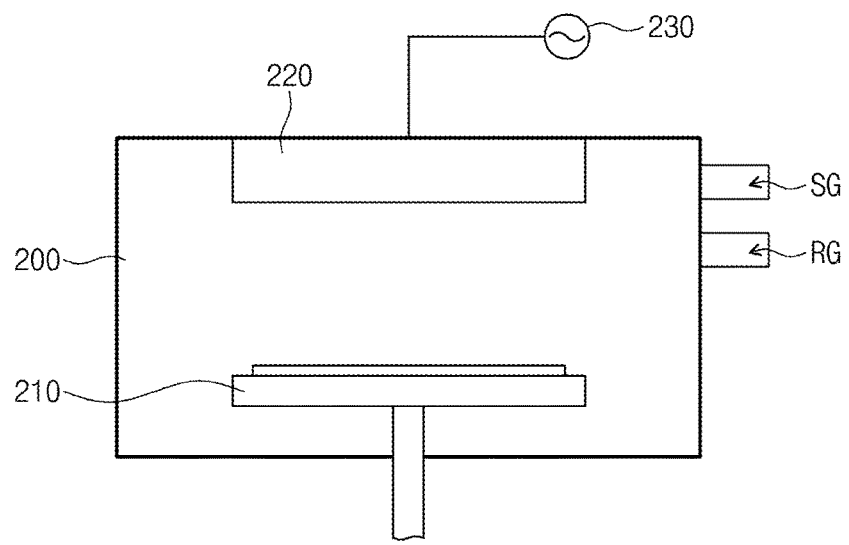
FIG. 1B is a sectional view illustrating a chamber configured to perform a deposition process of FIG. 1A.
Figure 2:
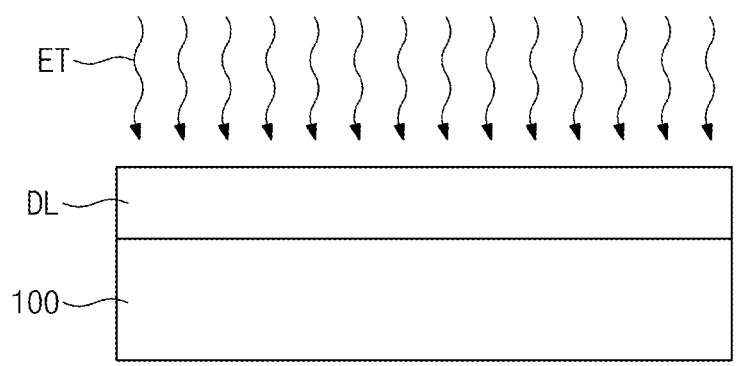

FIGS. 1A and 2 are sectional views illustrating a method of forming a low-k dielectric layer, according to example embodiments of the inventive concepts. FIG. 1B is a sectional view schematically illustrating a chamber configured to perform a deposition process of FIG. 1A.

Referring to FIGS. 1A and 1B, a preliminary dielectric layer PDL may be formed on a substrate 100. The substrate 100 may be a semiconductor substrate, which is formed of or include at least one of silicon, germanium, silicon-germanium, or compound semiconductor materials.

To begin with, a silicon precursor for forming the preliminary dielectric layer PDL may be prepared. The silicon precursor may contain a molecule with a porogen group. The porogen group may be directly combined with silicon atoms. In detail, the silicon precursor may contain a molecule having a structure of Si—($CH_2$)$_n$—Si (where n is 1 or 2), and the porogen group may be directly combined with silicon atoms in such the molecule. For example, the silicon precursor may contain at least one of compounds represented by the following Chemical Formula 1.

[Chemical Formula 1]

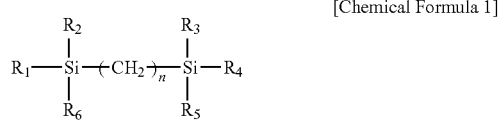

where n is 1 or 2. At least two of $R_1$, $R_2$, $R_3$, $R_5$, and $R_6$ are —O—$R_7$, and the others are each independently hydrogen, ($C_1$-$C_{10}$)alkyl, ($C_3$-$C_{10}$)alkenyl, ($C_3$-$C_{10}$)alkynyl, or ($C_1$-$C_{10}$)alkoxy. Here, $R_7$ is hydrogen, ($C_1$-$C_{10}$)alkyl, ($C_3$-$C_{10}$)alkenyl, or ($C_3$-$C_{10}$)alkynyl. As an example, in the case where each of R2 and R3 is —O—$R_7$, the compound may be represented by the following Chemical Formula 2.

[Chemical Formula 2]

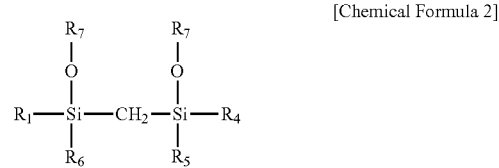

In the Chemical Formula 2, at least two of $R_1$, $R_2$, $R_3$, $R_5$, and $R_6$ are ($C_1$-$C_5$)alkoxy. In other words, in —O—$R_7$, $R_7$ is ($C_1$-$C_5$)alkyl. In more detail, at least three of $R_1$, $R_2$, $R_3$, $R_5$, and $R_6$ are methoxy. Here, the others of $R_1$, $R_2$, $R_3$, $R_5$, and $R_6$ are ($C_1$-$C_5$)alkyl. In this case, the compound may be represented by the following Chemical Formula 3.

[Chemical Formula 3]

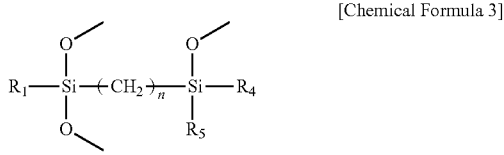

In the Chemical Formula 3, $R_4$ is the porogen group. In detail, $R_4$ is ($C_3$-$C_{10}$)alkenyl, ($C_3$-$C_{10}$)alkynyl, ($C_3$-$C_{10}$)aryl, ($C_3$-$C_{10}$)heteroaryl, ($C_3$-$C_{10}$)cycloalkyl, ($C_3$-$C_{10}$)cycloalkenyl, ($C_3$-$C_{10}$)cycloalkynyl, ($C_3$-$C_{10}$)heterocycloalkyl, ($C_3$-$C_{10}$)aryl($C_1$-$C_{10}$)alkyl, ($C_3$-$C_{10}$)cycloalkyl($C_1$-$C_{10}$)alkyl, or ($C_3$-$C_{10}$)heterocycloalkyl($C_1$-$C_{10}$)alkyl.

Here, the aryl, the heteroaryl, the cycloalkyl, the cycloalkenyl, the cycloalkynyl, and the heterocycloalkyl are unsubstituted or are each independently substituted with one or more selected from the group consisting of $(C_1$-$C_{10})$alkyl, $(C_3$-$C_{10})$alkenyl, $(C_3$-$C_{10})$alkynyl, $(C_1$-$C_{10})$alkoxy, halogen, cyano, nitro, and hydroxy. In addition, the heteroaryl and the heterocycloalkyl each independently include one or more heteroatoms selected from the group consisting of —$NR_8$—, —O—, and —S—. Here, $R_8$ is hydrogen or $(C_1$-$C_{10})$alkyl.

For example, $R_4$ is 1-propenyl group, 2-propenyl group, 1-butenyl group, 2-butenyl group, 3-butenyl group, 1-methyl-2-propenyl group, 2-methyl-2-propenyl group, 1-pentenyl group, 2-pentenyl group, 3-pentenyl group, 4-pentenyl group, 1-methyl-2-butenyl group, 2-methyl-2-butenyl group, 1-hexenyl group, 2-hexenyl group, 3-hexenyl group, 4-hexenyl group, 5-hexenyl group, phenyl group, xylene group, cyclopropyl group, cyclobutyl group, cyclopentyl group, cyclohexyl group, cycloheptyl group, cyclooctyl group, cyclopentenyl group, cyclopentadiene group, cyclohexadiene group, cycloheptadiene group, bicycloheptyl group, bicycloheptenyl group, cyclohexene oxide group, cyclopentene oxide group, terpinene group, limonene group, butadieneoxide, styrene, or fulvene.

$R_4$ may have a cyclic hydrocarbon structure. In detail, $R_4$ is $(C_3$-$C_{10})$aryl, $(C_3$-$C_{10})$heteroaryl, $(C_3$-$C_{10})$cycloalkenyl, $(C_3$-$C_{10})$cycloalkynyl, $(C_3$-$C_{10})$heterocycloalkyl, $(C_3$-$C_{10})$aryl$(C_1$-$C_{10})$alkyl, $(C_3$-$C_{10})$cycloalkyl$(C_1$-$C_{10})$alkyl, or $(C_3$-$C_{10})$heterocycloalkyl$(C_1$-$C_{10})$alkyl. In this case, it is possible to increase the number of pores to be formed in a dielectric layer, as will be described below.

The compound of Chemical Formula 1 may have a molecular mass ranging from 100 to 500. The compound of Chemical Formula 1 may have a vapor pressure of 0.1 Torr to 100 Torr at 100° C. In other words, the compound of Chemical Formula 1 may have a relatively high vapor pressure, and this may make it possible to more stably perform a chemical vapor deposition (CVD) or an atomic layer deposition (ALD) process. The compound of Chemical Formula 1 may be pyrolyzed under a process condition of 100° C.-500° C. In other words, the compound of Chemical Formula 1 is not easily decomposed at a relatively high temperature. That is, the compound of Chemical Formula 1 has improved thermal stability.

In example embodiments, the compound of Chemical Formula 1 may be at least one of the following compounds.

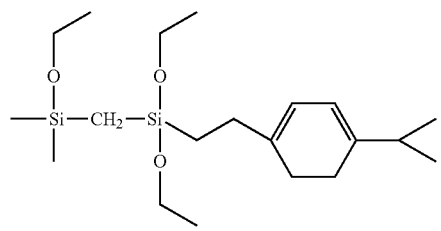
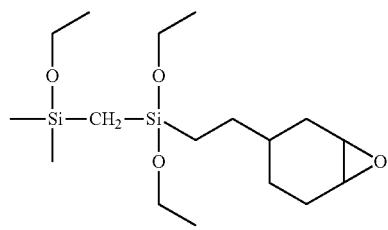
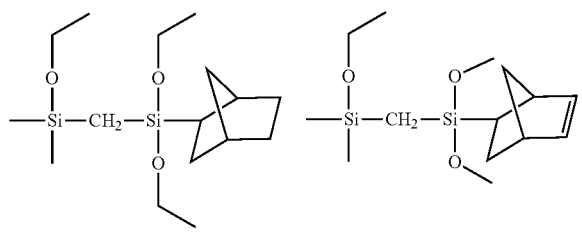
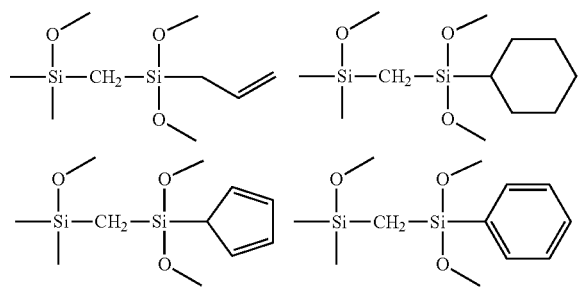
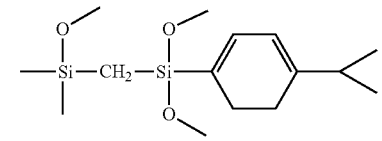
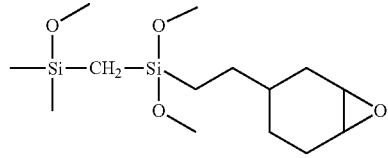
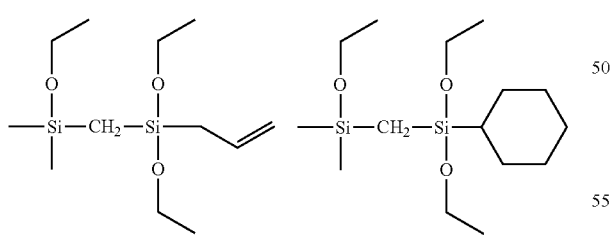
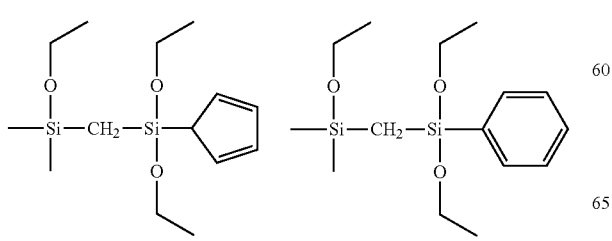
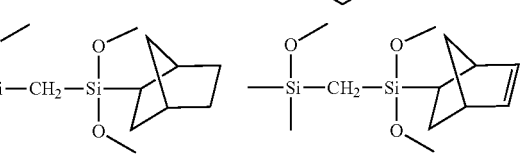

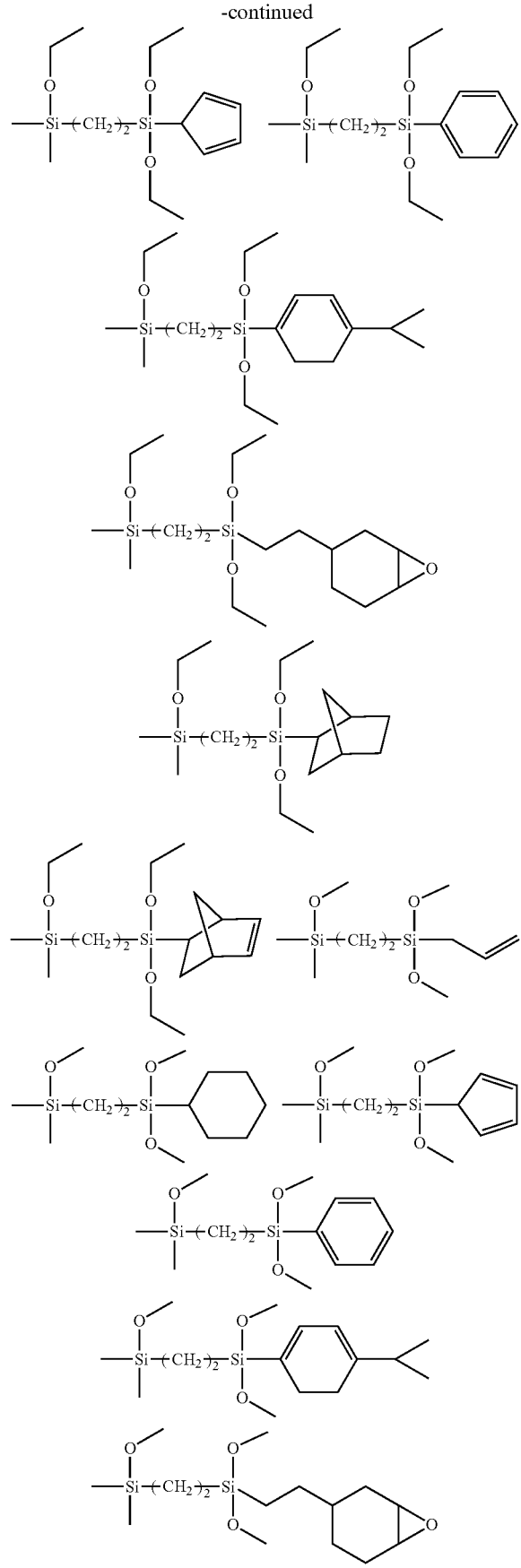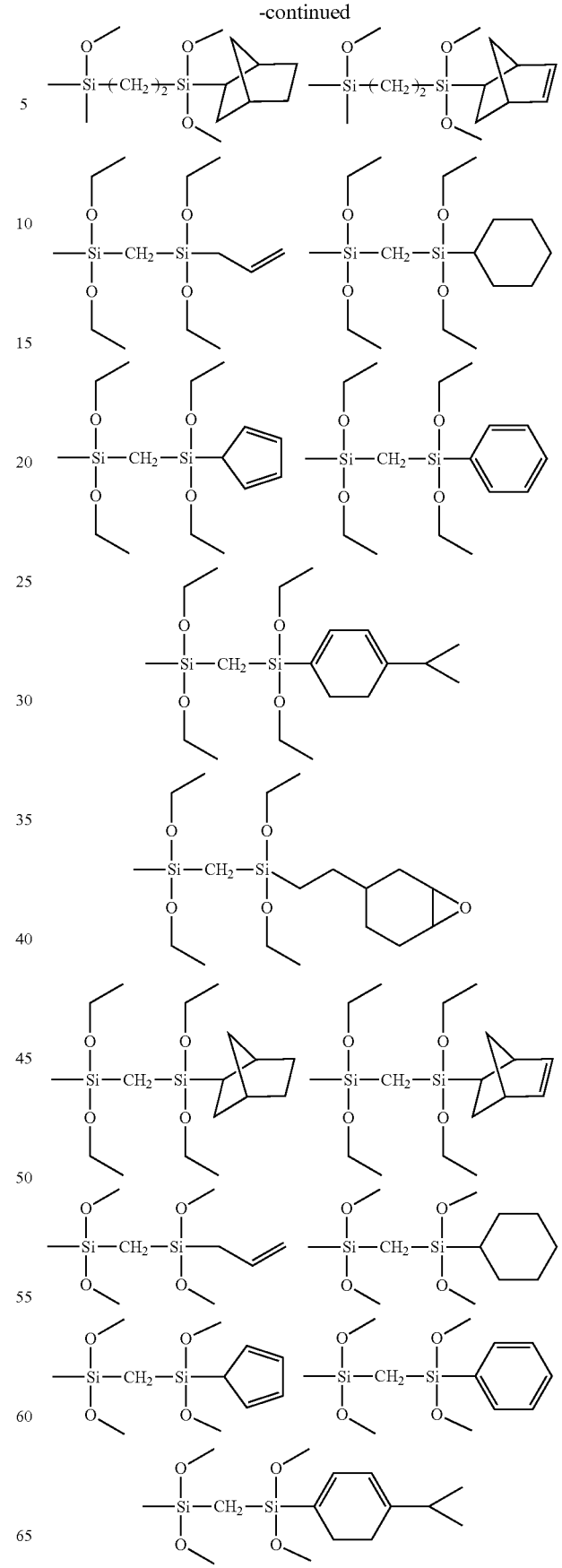

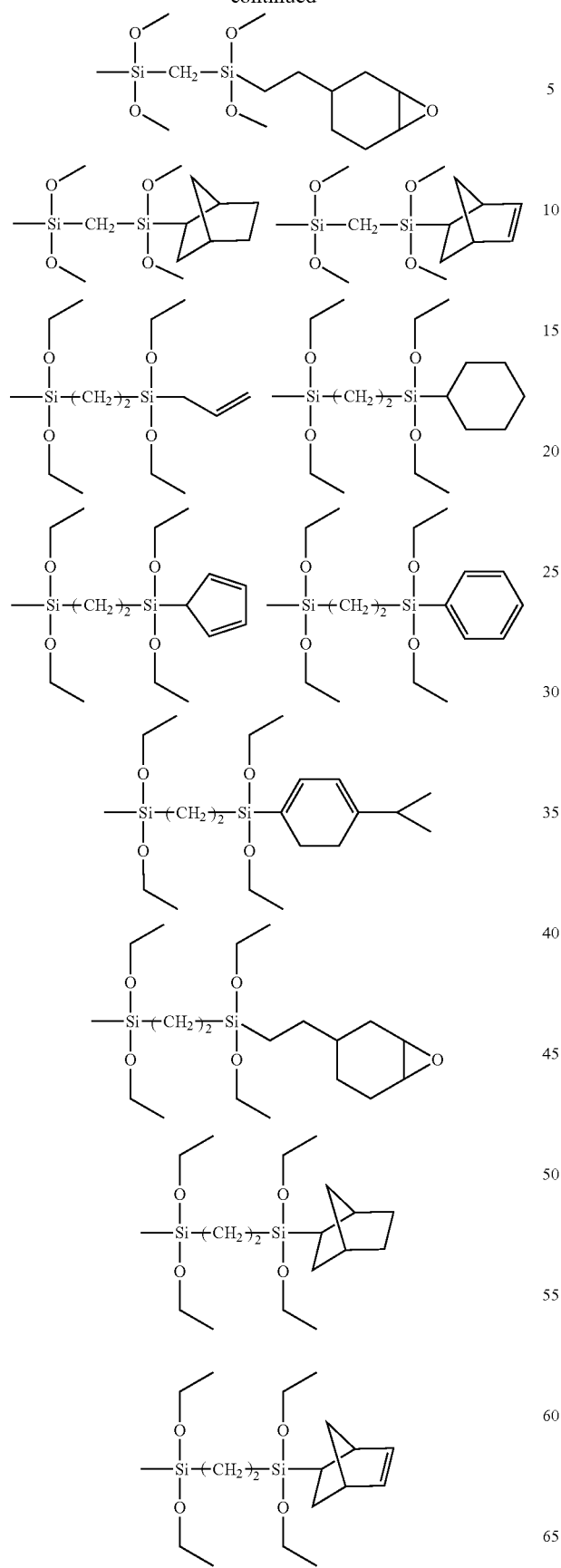
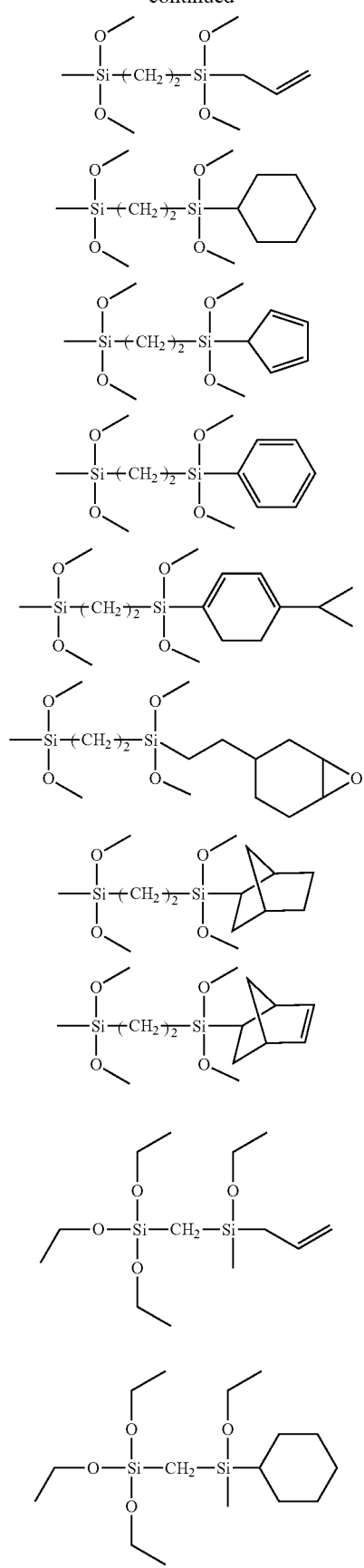

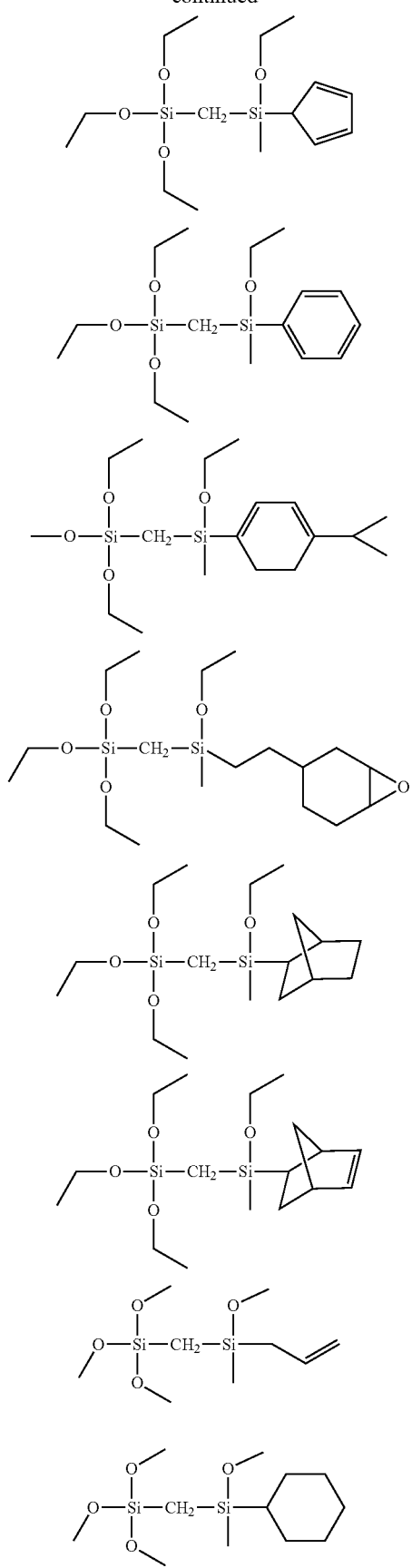
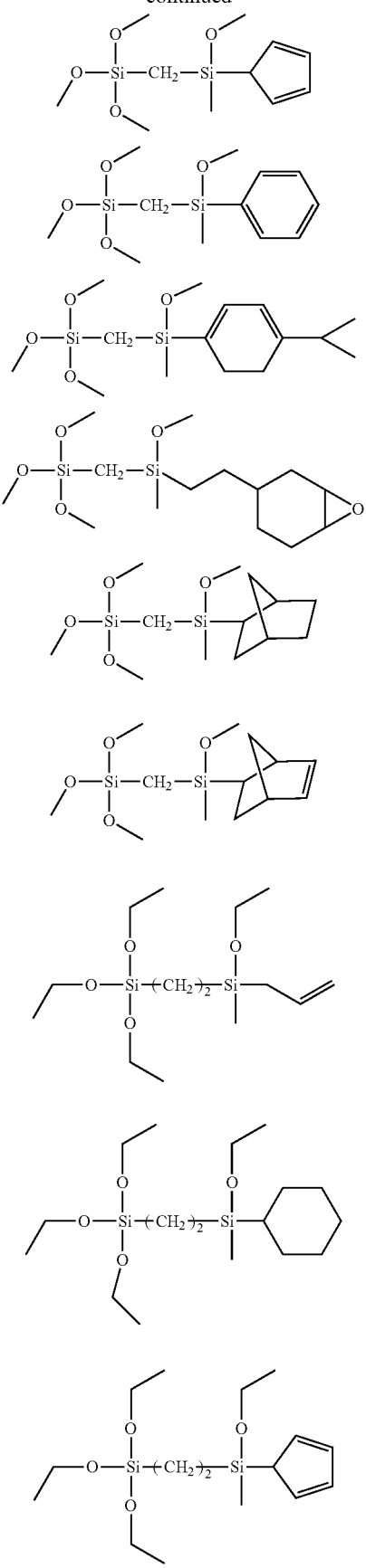

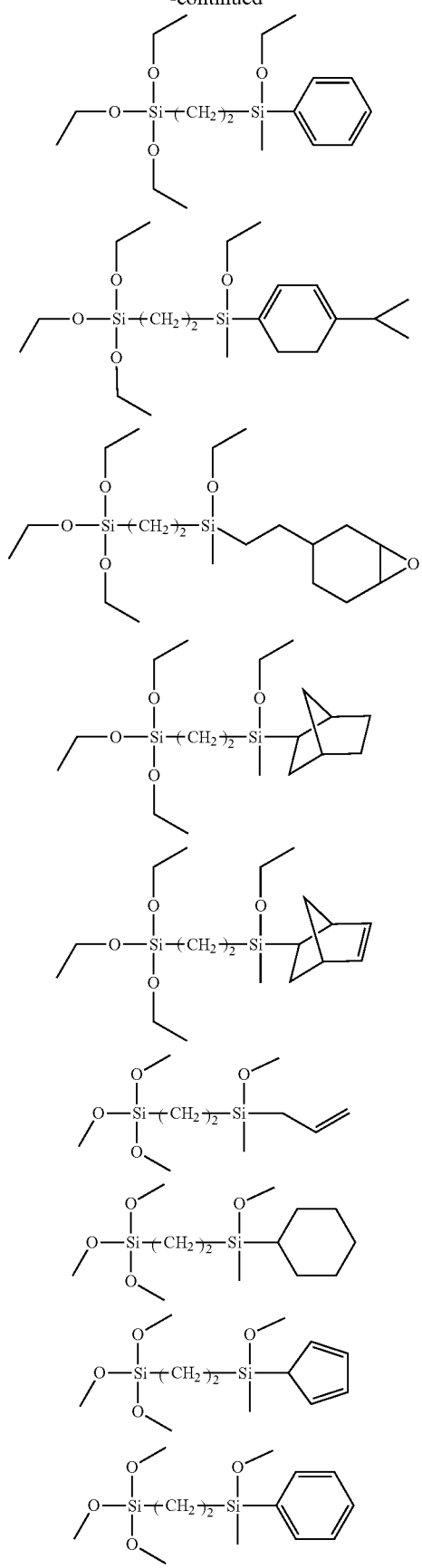
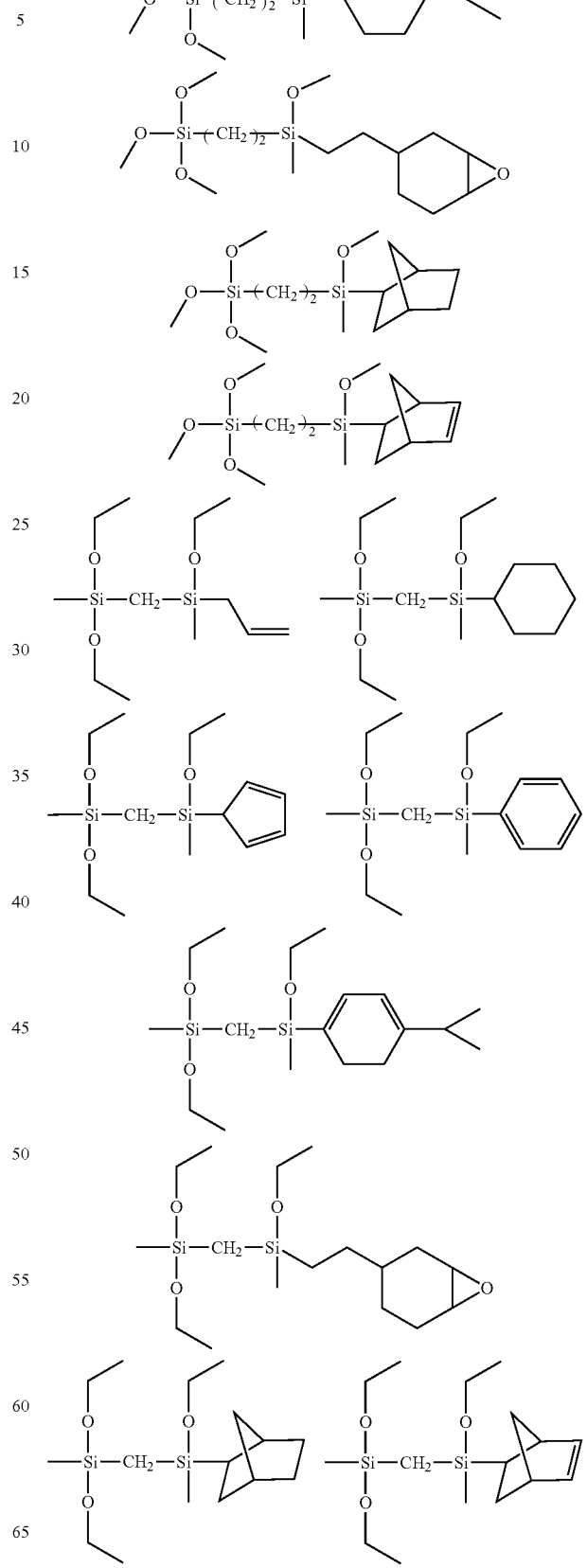

-continued
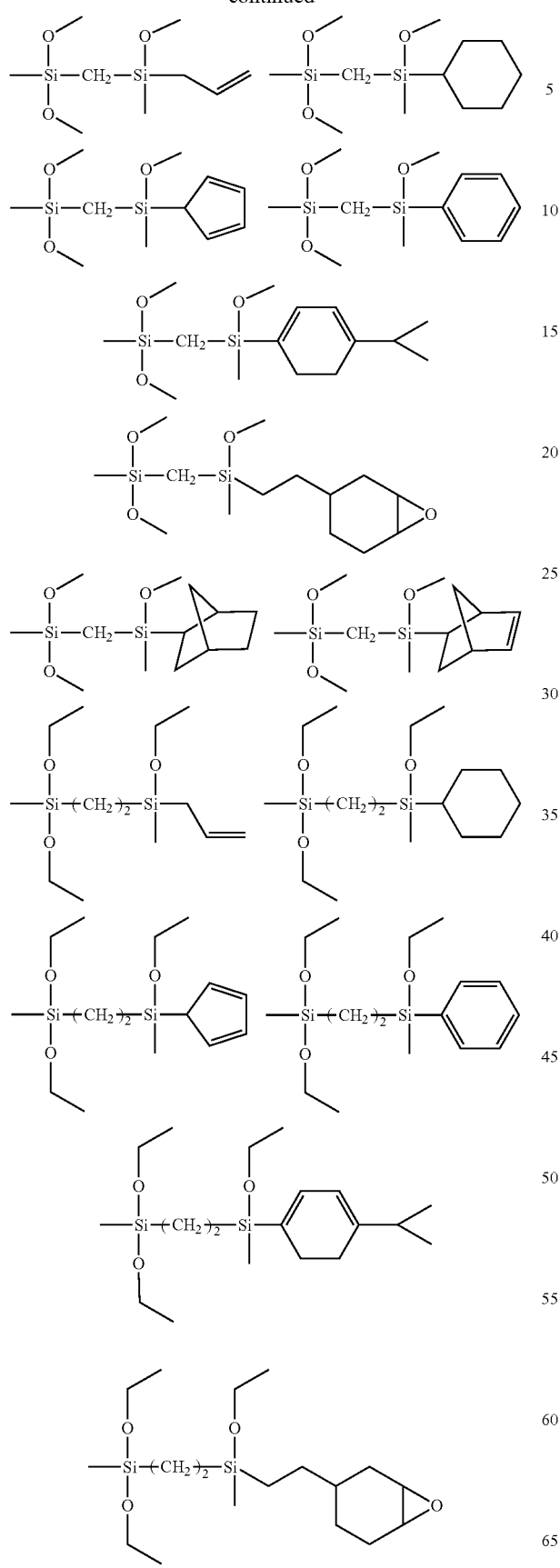
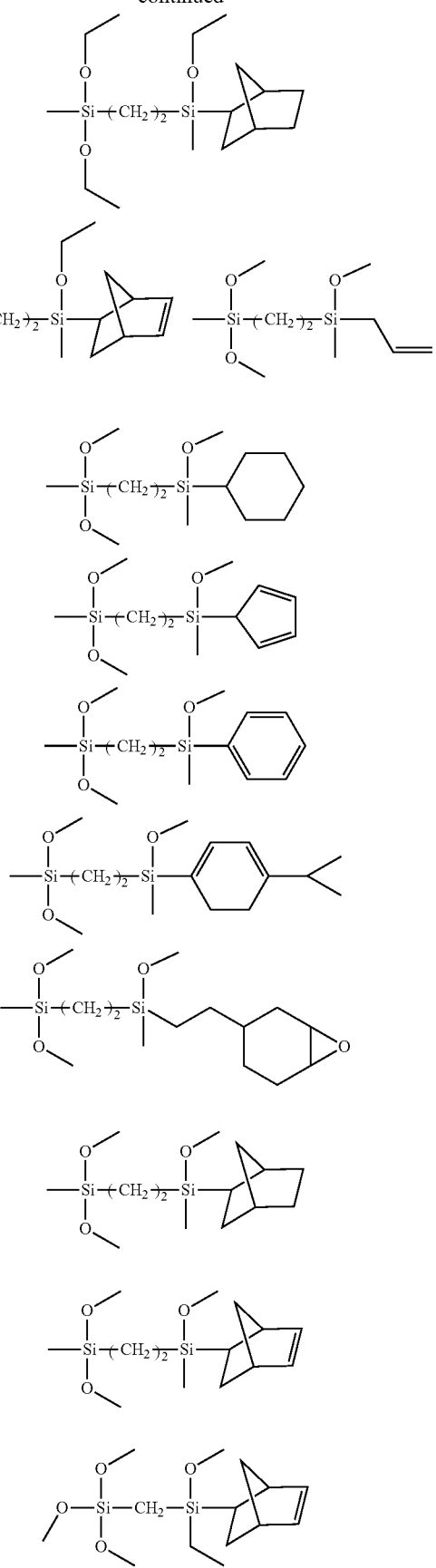

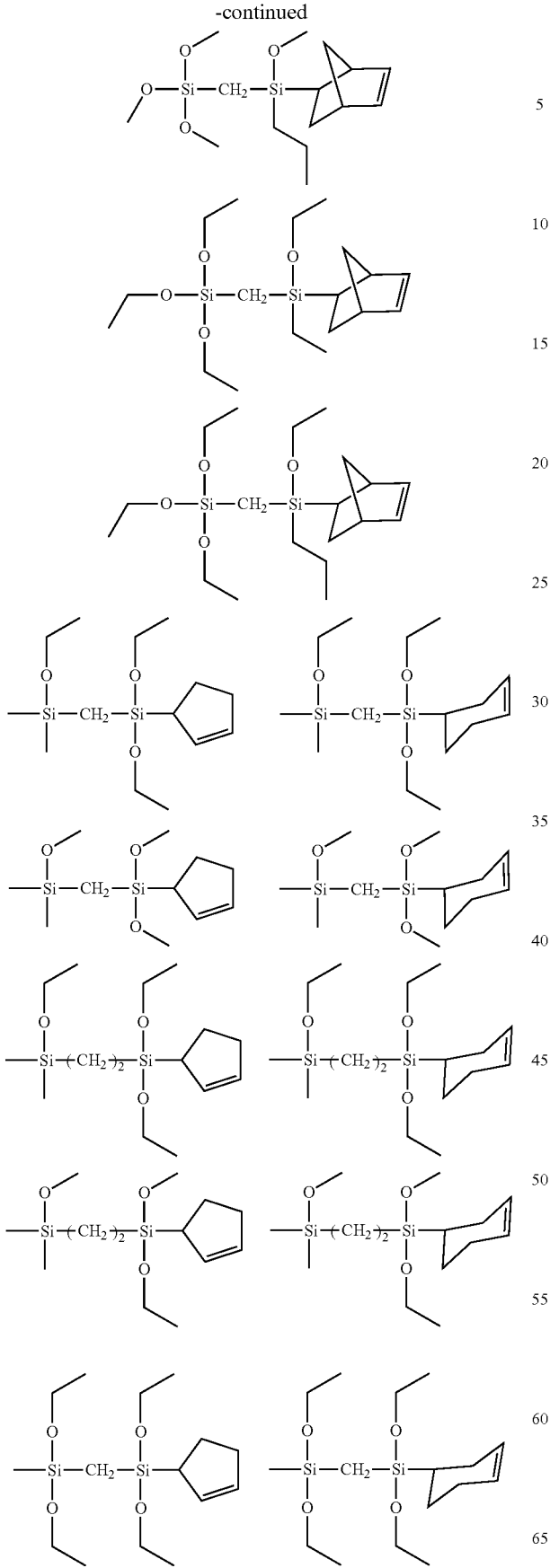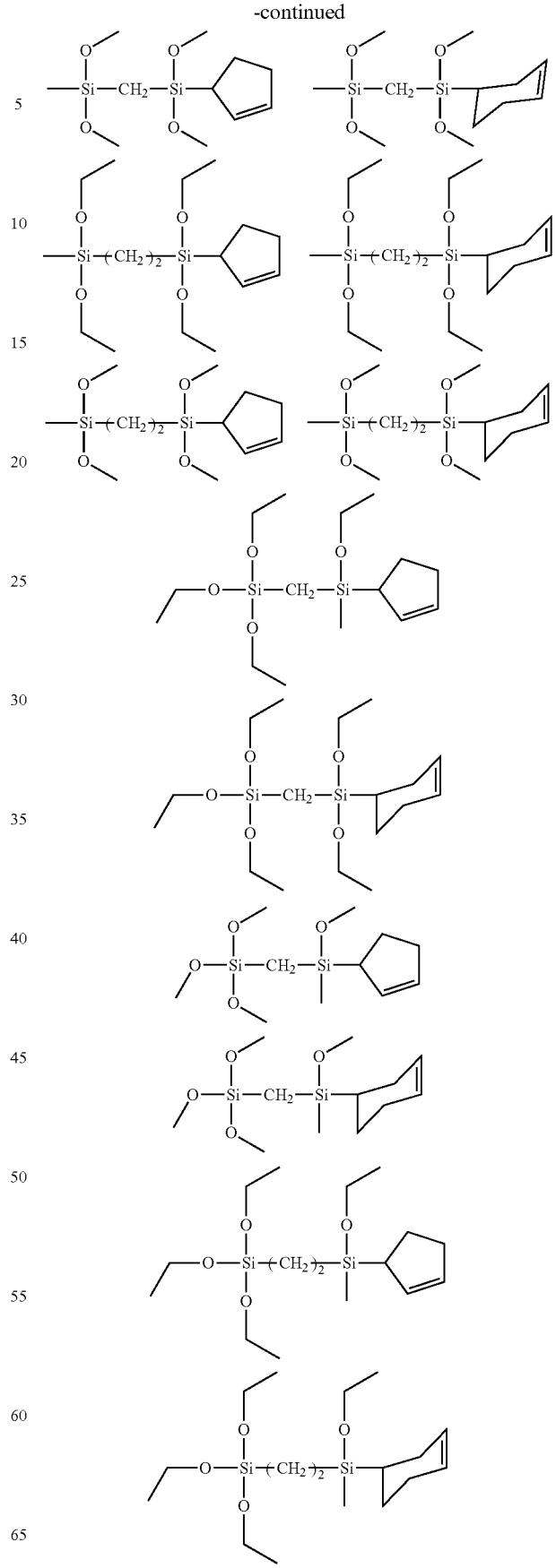

-continued

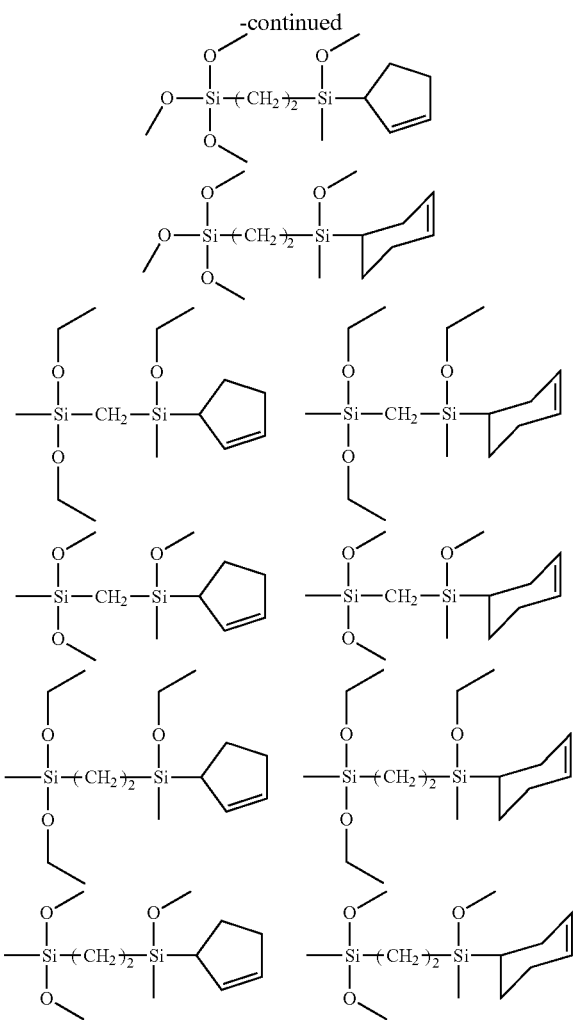

The preliminary dielectric layer PDL may be formed by a deposition process DP using the silicon precursor as a source gas SG. The deposition process DP may include a chemical vapor deposition (CVD) process or an atomic layer deposition (ALD) process. As an example, the CVD process may be a plasma-enhanced CVD (PE-CVD) process, and the ALD process may be a plasma-enhanced ALD (PE-ALD) process.

In detail, referring back to FIG. 1B, the substrate may be disposed in a chamber 200. As an example, the chamber 200 may be a plasma chamber. The substrate may be loaded on a plate 210. In example embodiments, the plate 210 may be used as a lower electrode. The plate 210 may be used to heat the substrate to a temperature of about 0° C.-500° C. As an example, the substrate may be heated up to a temperature of about 200° C.

The source gas SG and the reaction gas RG may be supplied into the chamber 200. Here, the source gas SG may be or contain the silicon precursor, and the reaction gas RG may be or contain an oxidizing agent. As an example, the reaction gas RG may contain at least one of $O_2$, $O_3$, $N_2O$, or $CO_2$. In example embodiments, the silicon precursor may be evaporated into gas phase in an evaporator, thereby forming the source gas SG. For example, the source gas SG may be formed by heating the silicon precursor in the evaporator.

Since, as described above, the silicon precursor has a relatively high vapor pressure, a relatively large amount of the silicon precursor may be converted into the source gas SG under a predetermined temperature of the evaporator. Accordingly, it may be possible to easily supply a relatively large amount of the source gas SG into the chamber 200, and this may make it possible to efficiently and stably perform the deposition process DP.

Meanwhile, an amount of the source gas SG may be changed depending on a process condition of the deposition process DP. For example, to increase the amount of the source gas SG, it may be necessary to increase a pressure of the source gas SG which is supplied into the chamber 200. For this, the temperature of the evaporator may be increased. In such a case, since the silicon precursor has a relatively improved thermal stability, it is possible to substantially suppress or prevent the chemical structure of the silicon precursor from being changed by the increase of the temperature of the evaporator (for example, even to 200° C. to 500° C.). Accordingly, this may allow the preliminary dielectric layer PDL to have a defect-free structure.

The source gas SG, along with a carrier gas supplied into the evaporator, may be supplied into the chamber 200. The carrier gas may include at least one of inert gases (e.g., helium, neon, argon, krypton, xenon, or radon). A flow rate of the carrier gas may range from 100 cc/min to 800 cc/min, and a flow rate of the reaction gas RG may range from 5 cc/min to 100 cc/min.

During the deposition process DP, the chamber 200 may be controlled to have an internal pressure of 0.1 Torr-10 Torr. An upper electrode 220 of the chamber 200 may be connected to an RF generator 230. During the deposition process DP, the RF generator 230 may be configured to apply an electric power (e.g., power of 1 W-1000 W and frequency of 5 MHz-20 MHz) to the upper electrode 220.

In the case where the silicon precursor is used to form the preliminary dielectric layer PDL, there may be the porogen groups in the preliminary dielectric layer PDL.

Referring to FIG. 2, an energy treatment ET may be performed on the preliminary dielectric layer PDL to form a dielectric layer DL. The energy treatment ET may include curing the preliminary dielectric layer PDL using various types of energy (e.g., thermal energy or light energy). For example, the energy treatment ET may be performed using a thermal annealing process or an ultraviolet light (UV) curing process.

The thermal annealing process may be performed to heat the substrate in a thermal treatment chamber of about 200° C.-800° C. for about 10 minutes to 240 minutes. The thermal annealing process may be performed at a temperature ranging from about 500° C. to about 600° C. The UV curing process may be performed on the substrate, for 0.1 minutes to 120 minutes, using a UV lamp, to which power of about 10 W to 200 W is applied. Here, the temperature of the substrate may range from 0° C. to 700° C.

As a result of the energy treatment ET, the porogen groups may be removed from the preliminary dielectric layer PDL. In detail, the energy treatment ET may be performed to break Si—$R_4$ bonds in the preliminary dielectric layer PDL, and thus, the porogen groups ($R_4$) may be volatilized and removed from the preliminary dielectric layer PDL. The removal of the porogen groups may result in the formation of pores in the dielectric layer DL. In other words, the pores may be formed at positions of the porogen groups, and thus, the dielectric layer DL may have a porous structure.

Figure 10:
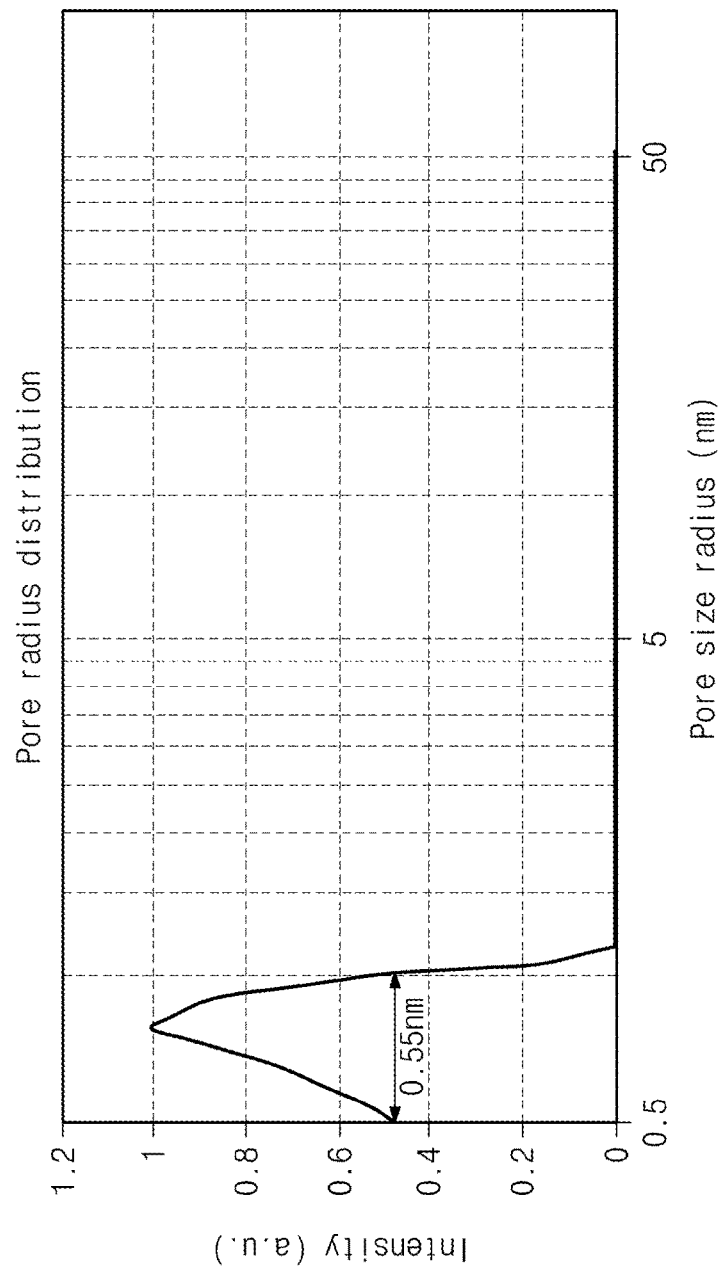
FIG. 10 is a graph showing a pore radius distribution of a dielectric layer according to example embodiments of the inventive concepts.

The dielectric layer DL may be formed to have a porosity of 8%-35%. Here, the porosity is defined as a ratio of a volume of pores to a total volume of the dielectric layer DL. In the dielectric layer DL, the pores may be formed to have a mean diameter of about 0.5 nm-5 nm. Furthermore, a radius distribution curve of the pores may have a Full-Width-at-Half-Maximum (FWHM) which is selected from a range of about 0.1 nm to 2.5 nm as shown in FIG. 10. It means that a pore size difference between a relatively large pore and a relatively small pore may be selected from a range of about 0.1 nm to 2.5 nm. In other words, the pores in the dielectric layer DL may have a uniform size.

The dielectric layer DL may be a low-k dielectric layer having a dielectric constant of 2.2-3. The dielectric layer DL may also have Young's modulus of about 6 GPa-15 GPa. In other words, the dielectric layer DL may have a porous structure but a high mechanical strength. Meanwhile, in the case where at least three of $R_1$, $R_2$, $R_3$, $R_5$, and $R_6$ in Chemical Formula 1 are methoxy, the dielectric layer DL may have Young's modulus of about 6 GPa-15 GPa (for example, about 8 GPa-15 GPa).

The dielectric layer DL may contain SiOCH. In such a case, the dielectric layer DL may have a carbon content ranging from 1 at % to 40 at %. The dielectric layer DL may be formed in such a way that a ratio of Si—$CH_3$ bonding unit to Si—O bonding unit ranges from 0.5 to 5. The dielectric layer DL may be formed in such a way that the ratio of Si—$CH_3$ bonding unit to Si—O bonding unit ranges from 1 to 4. In other words, the dielectric layer DL may be formed to contain a relatively large amount of Si—$CH_3$ bonds. The presence of the Si—$CH_3$ bonds may help to create Si—O cage structures in the dielectric layer DL. The Si—O cage structure may be a crystal structure including Si—O bonds that are three-dimensionally arranged about a nano-void located at a center of the structure. Here, the higher the porosity of the dielectric layer DL, the lower the dielectric constant of the dielectric layer DL. Furthermore, the higher the ratio of Si—$CH_3$ bonding unit to Si—O bonding unit, the higher the number or density of Si—$CH_3$ bonds in the dielectric layer DL. These properties of the dielectric layer DL may make it possible to prevent or suppress the dielectric layer DL from being damaged by plasma, which may be used in a process of forming an interconnection structure in the dielectric layer DL. In other words, it is possible to suppress plasma-induced damage in the dielectric layer DL.

The silicone-based structures in the dielectric layer DL may include Si—O network structures, in addition to the Si—O cage structures. The Si—O network structure may be a complex network structure including randomly-arranged Si—O bonding units. The presence of the Si—O network structures may contribute to increase mechanical strength of the dielectric layer DL. According to experimental results obtained by a Fourier transform infrared spectroscopy (FT-IR), a peak area of the Si—O network structure (ca. ~1040 $cm^{-1}$) was from 13 to 16, and a peak area of the Si—O cage structure (ca. ~1140 $cm^{-1}$) was from 7 to 12. Here, the ratio of Si—O cage structures to Si—O network structures may range from 0.5 to 1. In more detail, the ratio of Si—O cage structures to Si—O network structures may range from 0.6 to 1. In this case, the dielectric layer DL may have both of a high mechanical strength and a low dielectric constant.

Hereinafter, the silicon precursor and the dielectric layer described with reference to FIGS. 1A and 2 will be described with reference to detailed experimental examples. Compounds in the following experimental examples were analyzed using $_1$H Nuclear Magnetic Resonance (NMR) spectrometry.

Example 1: Preparation of 1-((bicycloheptenyl)diethoxysilyl)-2-(methyldiethoxysilyl)methane Step 1. Preparation of 1-(trichlorosilyl)-2-(methyldichlorosilyl)methane Acetonitrile (1500 mL) and (chloromethyl)dichloromethylsilane (500 g, 3.06 mol, 1.0 equivalent) were added into a flame-dried 5000 mL Schlenk flask and was heated up to 70° C. Triethylamine (340.37 g, 3.36 mol, 1.1 equivalent) was added into the reaction solution, and then, trichlorosilane (455.61 g, 3.36 mol, 1.1 equivalent) was slowly added into the flask while maintaining the temperature at 70° C. The reaction solution was stirred at 70° C. for 5 hours, was filtered, and then, was worked up with n-pentane (1500 mL) four times. The resulting solution was decompressed for removal of solvent and was purified (at 28° C. and 1.01 Torr) to obtain colorless liquid of $MeCl_2Si$—$CH_2$—$SiCl_3$ (160.54 g, yield: 20%).

$_1$H-NMR ($C_6D_6$) δ 0.38 (3H), 0.69 (2H).

Step 2. Preparation of 1-(bis(dimethylamino)chlorosilyl)-2-(bis(dimethylamino)methylsilyl)methane N-pentane 3000 mL and the 1-(trichlorosilyl)-2-(methyldichlorosilyl)methane (160.54 g, 0.61 mol, 1.0 equivalent) prepared in Step 1 were added into a flame-dried 5000 mL Schlenk flask, and diethylamine (330.84 g, 7.34 mol, 12.0 equivalent) was slowly added into the flask while maintaining the temperature at 0° C. The reaction solution was heated up to the room temperature (20° C.) and was stirred for 3 hours. The reaction solution was filtered, was decompressed for removal of solvent, and was purified at 78° C. and 0.8 Torr to obtain colorless liquid of $Me(NMe_2)_2Si$—$CH_2$—$Si(NMe_2)_2Cl$ (163.48 g, yield: 90%).

$_1$H-NMR ($C_6D_6$) δ 0.18 (3H), 0.30 (2H), 2.43-2.47 (24H).

Step 3. Preparation of 1-(bis(dimethylamino)silyl)-2-(bis(dimethylamino)methylsilyl)methane $LiAlH_4$ (7.31 g, 0.19 mol, 0.35 equivalent) was added into a flame-dried 1000 mL Schlenk flask, and THF (300 mL) was slowly added into the flask while maintaining the temperature at −30° C. The 1-(bis(dimethylamino)chlorosilyl)-2-(bis(dimethylamino)methylsilyl)methane (163.48 g, 0.55 mol, 1.0 equivalent) prepared in Step 2 was slowly added in the flask while maintaining the temperature at −30° C. The reaction solution was heated up to the room temperature (20° C.) and was stirred for 5 hours. The reaction solution was filtered, was decompressed for removal of solvent, and was purified at 56° C. and 0.5 Torr to obtain colorless liquid of $Me(NMe_2)_2Si$—$CH_2$—$Si(NMe_2)_2H$ (108.38 g, yield: 75%).

$_1$H-NMR ($C_6D_6$) δ 0.04 (2H), 0.16 (3H), 2.44-2.48 (24H), 4.48 (1H).

Step 4. Preparation of 1-(diethoxysilyl)-2-(diethoxy(methyl)silyl)methane

The 1-(bis(dimethylamino)silyl)-2-(bis(dimethylamino)methylsilyl)methane (108.38 g, 0.41 mol, 1.0 equivalent) prepared in Step 3 and n-pentane (1000 mL) were added into a flame-dried 3000 mL Schlenk flask, and ethanol (76.07 g, 1.65 mol, 4.0 equivalent) was slowly added into the flask while maintaining the temperature at 0° C. The reaction solution was heated up to the room temperature (20° C.) and was stirred for 5 hours. The reaction solution was filtered, was decompressed for removal of solvent, and was purified at 46° C. and 0.6 Torr to obtain colorless liquid of Me(EtO)$_2$Si—CH$_2$—Si(OEt)$_2$H (99.01 g, yield: 90%).

$_1$H-NMR (C$_6$D$_6$) δ 0.12 (2H), 0.25 (3H), 1.15 (12H), 3.78 (8H), 4.92 (1H).

Step 5. Preparation of 1-((bicycloheptenyl)diethoxysilyl)-2-(methyldiethoxysilyl)methane The 1-(diethoxysilyl)-2-(diethoxy(methyl)silyl)methane (99.01 g, 0.37 mol, 1.0 equivalent) prepared in Step 4 and dichloro(1, 5-cyclooctadiene)platinum(II) serving as catalyst were added into a flame-dried 1000 mL Schlenk flask. The reaction solution was heated up to 60° C., and then, norbornadiene (34.23 g, 0.37 mol, 1.0 equivalent) was slowly added into the flask. The reaction solution was stirred at 60° C. for 5 hours and was purified at 90° C. and 0.27 Torr to obtain colorless liquid compound (99.93 g, yield: 75%) represented by the following Chemical Formula.

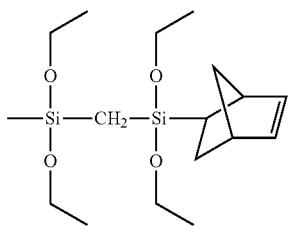 [SMILES: CCO[Si](C)(C[Si](OCC)(OCC)C1CC2C=CC1C2)OCC]

$_1$H-NMR (C$_6$D$_6$) δ −0.004 (exo, 2H), 0.05 (endo, 2H), 0.16 (exo, 3H), 0.24 (endo, 3H), 1.13 (exo, endo, 18H), 3.57-3.67 (exo, endo, 12H), 1.34-1.80, 2.78-2.88, 5.91-6.19 (bicycloheptenyl, 9H).

Example 2: Preparation of 1-((bicycloheptenyl)diethoxysilyl)-2-(methyldiethoxysilyl)ethane Step 1. Preparation of 1-(trichlorosilyl)-2-(methyldichlorosilyl)ethane Trichlorovinylsilane (200 g, 1.24 mol, 1.0 equivalent) and hexachloroplatinum(H$_2$Cl$_6$Pt6H$_2$O) serving as catalyst were added into a flame-dried 3000 mL Schlenk flask, and then, the reaction solution was heated up to 60° C. Dichloromethylsilane (156.7 g, 1.36 mol, 1.1 equivalent) was slowly added in the reaction solution. The mixed solution was refluxed for 8 hours to obtain MeCl$_2$Si—CH$_2$CH$_2$—SiCl$_3$ (384.81 g, yield: 98%).

$_1$H-NMR (C$_6$D$_6$) δ 0.21 (3H), 0.86 (2H), 1.06 (2H).

Step 2. Preparation of 1-(bis(dimethylamino)chlorosilyl)-2-(bis(dimethylamino)methylsilyl)ethane The 1-(trichlorosilyl)-2-(methyldichlorosilyl)ethane (384.81 g, 1.39 mol, 1.0 equivalent) prepared in Step 1 and n-pentane (3000 mL) were added into a flame-dried 5000 mL Schlenk flask, and dimethylamine (501.87 g, 11.13 mol, 8.0 equivalent) was slowly added into the flask while maintaining the temperature at 0° C. The reaction solution was heated up to the room temperature (20° C.) and was stirred for 3 hours. The reaction solution was filtered, was decompressed for removal of solvent, and then, colorless liquid of Me(NMe$_2$)$_2$Si—CH$_2$CH$_2$—Si(NMe$_2$)$_2$Cl (367.88 g, yield: 85%) was obtained.

$_1$H-NMR (C$_6$D$_6$) δ 0.07 (3H), 0.78-0.91 (4H), 2.45 (24H).

Step 3. Preparation of 1-(bis(dimethylamino)silyl)-2-(bis(dimethylamino)methylsilyl)ethane LiAlH$_4$ (15.71 g, 0.41 mol, 0.35 equivalent) was added into a flame-dried 2000 mL Schlenk flask, and then, THF (500 mL) was slowly added into the flask while maintaining the temperature at −30° C. The 1-(bis(dimethylamino)chlorosilyl)-2-(bis(dimethylamino)methylsilyl)ethane (357.88 g, 1.18 mol, 1.0 equivalent) prepared in Step 2 was slowly added in the flask while maintaining the temperature at −30° C. The reaction solution was heated up to the room temperature (20° C.) and was stirred for 5 hours. The reaction solution was filtered, was decompressed for removal of solvent, and was purified at 73° C. and 1.66 Torr to obtain colorless liquid Me(NMe$_2$)$_2$Si—CH$_2$CH$_2$—Si(NMe$_2$)$_2$H (245.36 g, yield: 75%).

$_1$H-NMR (C$_6$D$_6$) δ 0.10 (3H), 0.69 (4H), 2.47 (12H), 2.52 (12H), 4.59 (1H).

Step 4. Preparation of 1-(diethoxysilyl)-2-(diethoxy(methyl)silyl)ethane

The 1-(bis(dimethylamino)silyl)-2-(bis(dimethylamino)methylsilyl)ethane (245.36 g, 0.89 mol, 1.0 equivalent) prepared in Step 3 and n-pentane (1000 mL) were added into a flame-dried 3000 mL Schlenk flask, and then, ethanol (163.48 g, 3.55 mol, 4.0 equivalent) was slowly added into the flask while maintaining the temperature at 0° C. The reaction solution was heated up to the room temperature (20° C.) and was stirred for 5 hours. The reaction solution was filtered, was decompressed for removal of solvent, and then, colorless liquid of Me(EtO)$_2$Si—CH$_2$CH$_2$—Si(OEt)$_2$H (218.99 g, yield: 88%) was obtained.

$_1$H-NMR (C$_6$D$_6$) δ 0.11 (3H), 0.81 (4H), 1.10-1.14 (12H), 3.64-3.66 (4H), 3.71-3.73 (4H), 4.80 (1H).

Step 5. Preparation of 1-((2-cycloheptenyl)diethoxysilyl)-2-(methyldiethoxysilyl)ethane The 1-(diethoxysilyl)-2-(diethoxy(methyl)silyl)ethane (218.99 g, 0.78 mol, 1.0 equivalent) prepared in Step 4 and dichloro(1, 5-cyclooctadiene)platinum(II) serving as catalyst were added into a flame-dried 1000 mL Schlenk flask. The reaction solution was heated up to 60° C., and then, norbornadiene (71.93 g, 0.78 mol, 1.0 equivalent) was slowly added into the flask. The mixed solution was stirred at 60° C. for 5 hours, was purified at 95° C. and 0.18 Torr to obtain colorless liquid compound (203.65 g, yield: 70%) represented by the following Chemical Formula.

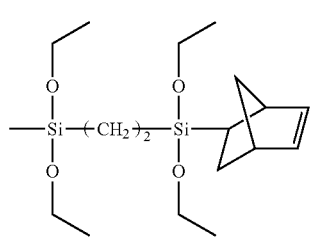 [SMILES: CCO[Si](C)(C[Si](OCC)(OCC)C1CC2C=CC1C2)OCC]

$_1$H-NMR (C$_6$D$_6$) δ 0.16 (3H), 0.84 (4H), 1.15 (12H), 3.70 (8H), 0.6-3.05, 5.91-6.12 (bicycloheptenyl, 9H).

Example 3: Preparation of 1-(phenylethoxymethylsilyl)-2-(methyldiethoxysilyl)ethane

Step 1. Preparation of Diethylaminomethylphenylchlorosilane

Pentane (1500 mL) and dichloromethylphenylsilane (150 g, 0.79 mol, 1.0 equivalent) were added into a flame-dried 5000 mL Schlenk flask, and diethylamine (114.8 g, 1.57 mol, 2.0 equivalent) was slowly added into the flask, while maintaining the temperature at 0° C. The reaction solution was heated up to the room temperature (20° C.) and was stirred for 12 hours. The reaction solution was filtered, was decompressed for removal of solvent, and then, diethylaminomethylphenylchlorosilane (159.12 g, yield: 89%) was obtained.

$_1$H-NMR (C$_6$D$_6$) δ 0.5 (3H), 0.89 (6H), 2.75 (4H), 7.16 (3H), 7.78 (2H).

Step 2. Preparation of Diethylaminomethylsilane

LiAlH$_4$ (7.42 g, 0.2 mol, 0.28 equivalent) was added into a flame-dried 3000 mL Schlenk flask, and THF (1500 mL) was added into the flask while maintaining the temperature at −10° C. The ethylaminomethylphenylchlorosilane (159 g, 0.70 mol, 1.0 equivalent) prepared in Step 1 was slowly added into the reaction solution. The reaction solution was slowly heated up to the room temperature (70° C.) and was stirred for 12 hours. The resulting solution was decompressed for removal of solvent and added with hexane (1000 mL). The resulting solution was stirred for 30 minutes, was filtered, was decompressed for removal of solvent, and then, diethylaminomethylsilane (67.53 g, yield: 50%) was obtained.

$_1$H-NMR (C$_6$D$_6$) δ 0.31 (3H), 0.97 (6H), 2.79 (4H), 5.13 (1H), 7.28 (3H), 7.63 (2H).

Step 3. Preparation of Ethoxymethylsilane

The diethylaminosilane (67.53 g, 0.35 mol, 1.0 equivalent) prepared in Step 2 and n-pentane (1500 mL) were added into a flame-dried 5000 mL Schlenk flask, and ethanol (32.18 g, 0.7 mol, 2.0 equivalent) was slowly added into the flask while maintaining the temperature at 0° C. The reaction solution was heated up to the room temperature, was stirred for 12 hours, was filtered, was decompressed for removal of solvent, and then, ethoxymethylsilane (40.65 g, yield: 70%) was obtained.

$_1$H-NMR (C$_6$D$_6$) δ 0.33 (3H), 1.12 (3H), 3.58 (2H), 5.21 (1H), 7.2 (3H), 7.53 (2H).

Step 4. Preparation of diethoxymethyl(vinyl)silane

Dichloromethyl(vinyl)silane (50 g, 0.35 mol, 1.0 equivalent) and n-pentane (1500 mL) were added into a flame-dried 3000 mL Schlenk flask, and then, triethylamine (73.52 g, 0.73 mol, 2.05 equivalent) was slowly added into the flask while maintaining the temperature at 0° C. Thereafter, ethanol (33.47 g, 0.73 mol, 2.05 equivalent) was slowly added into the reaction solution. The reaction solution was heated up to the room temperature, was stirred for 12 hours, was filtered, was decompressed for removal of solvent, and then, diethoxymethyl(vinyl)silane (39 g, yield: 68%) was obtained.

$_1$H-NMR (C$_6$D$_6$) δ 0.18 (3H), 1.13 (6H), 3.71 (4H), 5.8-6.3 (3H).

Step 5. Preparation of 1-(phenylethoxymethylsilyl)-2-(diethoxymethylsilyl)ethane The ethoxymethylsilane (40.65 g, 0.24 mol, 1.0 equivalent) prepared in Step 3 and hexachloroplatinum (H$_2$Cl$_6$Pt6H$_2$O) serving as catalyst were added into a flame-dried 5000 mL Schlenk flask. The reaction solution was heated up to 60° C., and the diethoxymethyl(vinyl)silane (39 g, 0.24 mol, 1.0 equivalent) prepared in Step 4 was slowly added into the flask. The reaction solution was refluxed for 8 hours to obtain compound (75 g, yield: 94%) represented by the following Chemical Formula.

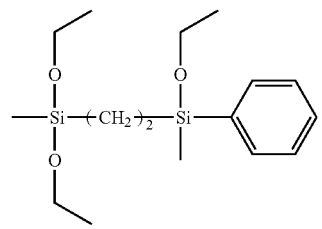 [SMILES: CCO[Si](C)(C[Si](C)(OCC)c1ccccc1)OCC]

$_1$H-NMR (C$_6$D$_6$) δ 0.11 (3H), 0.34 (3H), 0.96 (2H), 0.99 (2H), 1.11 (9H), 3.61 (2H), 3.66 (4H), 7.21 (3H), 7.59 (2H).

Example 4: Preparation of 1-((bicycloheptenyl)ethoxymethylsilyl)-2-(triethoxysilyl)methane

Step 1. Preparation of 1-(methylchlorosilyl)-2-(trichlorosilyl)methane

Magnesium(Mg) (34.37 g, 1.41 mol, 1.3 equivalent) and THF 100 mL were added into a flame-dried 5000 mL Schlenk flask and were heated up to 60° C. A mixed solution of (chloromethyl)trichlorosilane (200 g, 1.09 mol, 1.0 equivalent) and dichloromethylsilane (187.63 g, 1.63 mol, 1.5 equivalent) was slowly added into the reaction solution. The reaction solution was stirred at 60° C. for 10 hours, was filtered, and then, was worked up with n-pentane (1500 mL) four times. The solution was decompressed for removal of solvent and was purified (at 38° C. and 0.8 Torr) to obtain colorless liquid of Cl$_3$Si—CH$_2$—SiMeCl(H) (99.20 g, yield: 40%).

$_1$H-NMR (C$_6$D$_6$) δ 0.12 (3H), 0.41-0.58 (2H), 4.78 (1H).

Step 2. Preparation of 1-(ethoxy(methyl)chlorosilyl)-2-(triethoxysilyl)methane N-pentane (2000 mL) and the 1-(methylchlorosilyl)-2-(trichlorosilyl)methane (99.20 g, 0.44 mol, 1.0 equivalent) prepared in Step 1 were added into a flame-dried 5000 mL Schlenk flask, and triethylamine (220.07 g, 2.18 mol, 5.0 equivalent) and ethanol (100.20 g, 2.18 mol, 5.0 equivalent) were slowly added into the flask while maintaining the temperature at 0° C. The reaction solution was heated up to the room temperature (20° C.) and was stirred for 5 hours. The reaction solution was filtered, was decompressed for removal of solvent, and was purified at 42° C. and 0.4 Torr to obtain colorless liquid of (EtO)$_3$Si—CH$_2$—SiMe(OEt)(H) (104.32 g, yield: 90%).

$_1$H-NMR (C$_6$D$_6$) δ 0.08-0.11 (2H), 0.42 (3H), 1.09-1.18 (12H), 3.57-3.65 (2H), 3.71-3.84 (6H), 4.98 (1H).

Step 3. Preparation of 1-((bicycloheptenyl)ethoxymethylsilyl)-2-(triethoxysilyl)methane The 1-(ethoxy(methyl)chlorosilyl)-2-(triethoxysilyl)methane (104.32 g, 0.39 mol, 1.0 equivalent) prepared in Step 2, along with dichloro(1, 5-cyclooctadiene)platinum(II) serving as catalyst, were added into a flame-dried 1000 mL Schlenk flask. The reaction solution was heated up to 60° C. and was slowly added with norbornadiene (36.07 g, 0.39 mol, 1.0 equivalent). The solution was stirred at 60° C. for 5 hours and was purified at 90° C. and 0.23 Torr to obtain colorless liquid compound (105.29 g, yield: 75%) represented by the following Chemical Formula.

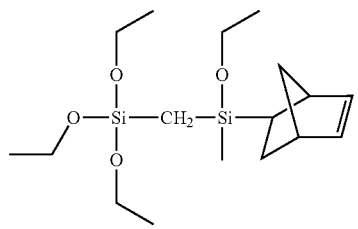 [SMILES: CCO[Si](C[Si](C)(OCC)C1CC2C=CC1C2)(OCC)OCC]

$_1$H-NMR (C$_6$D$_6$) δ 0.01 (exo, 2H), 0.05 (endo, 2H), 0.24 (exo, 3H), 0.34 (endo, 3H), 1.16-1.42 (exo, endo, 24H), 3.65-3.79 (exo, endo, 16H), 1.18-2.17, 2.80-3.12, 5.94-6.22 (bicycloheptenyl, 9H).

Example 5: Preparation of 1-((2-cycloheptenyl) ethoxymethylsilyl)-2-(methyldiethoxysilyl)methane Step 1. Preparation of 1-(methylchlorosilyl)-2-(dichloromethylsilyl)methane Magnesium(Mg) (28.99 g, 1.19 mol, 1.3 equivalent) and THF (100 mL) were added into a flame-dried 5000 mL Schlenk flask and the reaction solution was heated up to 60° C. A mixed solution of (chloromethyl)dichloromethylsilane (150 g, 0.92 mol, 1.0 equivalent) and dichloromethylsilane (158.29 g, 1.38 mol, 1.5 equivalent) was slowly added into the reaction solution. The reaction solution was stirred at 60° C. for 10 hours, was filtered, and then, was worked up with n-pentane (1500 mL) four times. The solution was decompressed for removal of solvent and was purified (at 40° C. and 2.8 Torr) to obtain colorless liquid of MeCl$_2$Si—CH$_2$—SiMeCl(H) (123.82 g, yield: 65%).

$_1$H-NMR (C$_6$D$_6$) δ 0.18 (3H), 0.37 (2H), 0.47 (3H), 4.83 (1H).

Step 2. Preparation of 1-(ethoxy(methyl)chlorosilyl)-2-(diethoxymethylsilyl)methane The 1-(methylchlorosilyl)-2-(dichloromethylsilyl)methane (123.82 g, 0.60 mol, 1.0 equivalent) prepared in Step 1 and n-pentane (2000 mL) were added into a flame-dried 5000 mL Schlenk flask, and triethylamine (187.05 g, 1.85 mol, 3.1 equivalent) and ethanol (85.16 g, 1.85 mol, 3.1 equivalent) were slowly added into the flask while maintaining the temperature at 0° C. The reaction solution was heated up to the room temperature (20° C.) and was stirred for 5 hours. The reaction solution was filtered, was decompressed for removal of solvent, and was purified at 76° C. and 0.24 Torr to obtain colorless liquid of Me(EtO)$_2$Si—CH$_2$—SiMe(OEt)(H) (119.85 g, yield: 85%).

$_1$H-NMR (C$_6$D$_6$) δ 0.08 (2H), 0.17 (3H), 0.38 (3H), 1.13 (12H), 3.61-3.83 (8H), 4.68 (1H).

Step 3. Preparation of 1-((2-cycloheptenyl) ethoxymethylsilyl)-2-(diethoxymethylsilyl)methane The 1-(ethoxy(methyl)chlorosilyl)-2-(diethoxymethylsilyl)methane (119.85 g, 0.51 mol, 1.0 equivalent) prepared in Step 2 and dichloro(1, 5-cyclooctadiene)platinum(II) serving as catalyst were added into a flame-dried 1000 mL Schlenk flask. The reaction solution was heated up to 60° C., and then, norbornadiene (46.70 g, 0.51 mol, 1.0 equivalent) was slowly added in the reaction solution. The reaction solution was stirred at 60° C. for 5 hours and was purified at 88° C. and 0.18 Torr to obtain colorless liquid compound (116.58 g, yield: 70%) represented by the following Chemical Formula.

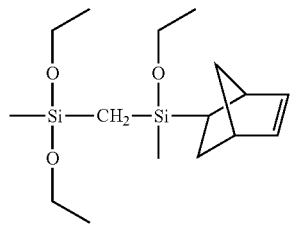 [SMILES: CCO[Si](C)(C[Si](C)(OCC)C1CC2C=CC1C2)OCC]

$_1$H-NMR (C$_6$D$_6$) δ 0.04 (exo, 2H), 0.06 (endo, 2H), 0.17 (exo, 3H), 0.25 (endo, 3H), 1.14 (exo, endo, 18H), 3.57-3.69 (exo, endo, 12H), 0.54, 1.70-1.82, 2.79-2.94, 5.95-6.19 (bicycloheptenyl, 9H).

Examples 6 to 10: Formation of Dielectric Layer Using Silicon Precursors of Examples 1 to 5

A substrate was disposed in a PE-CVD chamber. A temperature of the substrate was heated up to 200° C. and was maintained until a deposition process was finished. A silicon precursor was supplied into the chamber at a flow rate of 475 cc/min, along with a carrier gas (e.g., 400 sccm argon gas), and here, the compound prepared in each of Examples 1 to 5 was used as the silicon precursor. Also, oxygen gas serving as a reaction gas (e.g., oxidizing agent) was supplied into the chamber. The oxygen gas was supplied at a flow rate of 20 cc/min. RF power of 13.56 MHz and 50 W was applied to an upper electrode of the chamber. An internal pressure of the chamber was controlled to 0.8 torr. As a result, a preliminary dielectric layer was deposited on the substrate.

A thermal annealing process (N$_2$, 15SLM) or a UV curing process was performed on the substrate provided with the preliminary dielectric layer. The thermal annealing process was performed at a temperature of 500° C. for 2 hours. The UV curing process was performed on the substrate, whose temperature was heated up to 400° C., for 10 minutes. A porous dielectric layer was formed by removing the porogen group from the preliminary dielectric layer through such an energy treatment.

Dielectric layers (Examples 6 to 10) were formed using the compounds, respectively, of Examples 1 to 5, and then, dielectric constants and Young's moduli of them were measured. Chemical structures of the dielectric layers (Examples 6 to 10) were analyzed using an infrared spectrophotometer. In the analysis using the infrared spectrophotometer, the dielectric layers (Examples 6 to 10) were controlled to have the same thickness of 400 nm, and the thicknesses of the dielectric layers (Examples 6 to 10) were measured using an ellipsometer. In addition, carbon contents of the dielectric layers (Examples 6 to 10) were measured using an X-ray photoelectron spectroscopy (XPS) system.

A first dielectric layer (Example 6) formed using the silicon precursor of Example 1 had a dielectric constant of 2.32 and Young's modulus of 8.59 GPa. The first dielectric layer had a carbon content of 25 at %, a pore mean diameter of 1.4 nm, an FWHM (in pore radius distribution) of 0.45 nm, and porosity of 22%.

A second dielectric layer (Example 7) formed using the silicon precursor of Example 2 had a dielectric constant of 2.38 and Young's modulus of 7.95 GPa. The second dielectric layer had a carbon content of 30 at %, a pore mean diameter of 1.8 nm, an FWHM (in pore radius distribution) of 0.65 nm, and porosity of 28%.

A third dielectric layer (Example 8) formed using the silicon precursor of Example 3 had a dielectric constant of 2.40 and Young's modulus of 7.86 GPa. The third dielectric layer had a carbon content of 20 at %, a pore mean diameter of 1.2 nm, and porosity of 17%.

Radii of pores in the third dielectric layer (Example 8) were measured, and FIG. 10 shows a pore radius distribution obtained from the measurement. In the pore radius distribution curve shown in FIG. 10, an FWHM was about 0.55 nm. This result means that uniformly small pores were formed in the third dielectric layer.

A fourth dielectric layer (Example 9) formed using the silicon precursor of Example 4 had a dielectric constant of 2.35 and Young's modulus of 9.85 GPa. The fourth dielectric layer had a carbon content of 27 at %, a pore mean diameter of 1 nm, an FWHM (in pore radius distribution) of 0.35 nm, and porosity of 25%.

A fifth dielectric layer (Example 10) formed using the silicon precursor of Example 5 had a dielectric constant of 2.41 and Young's modulus of 7.75 GPa. The fifth dielectric layer had a carbon content of 20 at %, a pore mean diameter of 1.5 nm, an FWHM (in pore radius distribution) of 0.55 nm, and porosity of 20%.

The following TABLE 1 shows analysis data of the first to fifth dielectric layers (Examples 6 to 10) measured by the infrared spectrophotometer.

TABLE 1

|  | Si—O network | Si—O Cage | SiO cage/SiO network | Si—CH$_3$/Si—O |
| --- | --- | --- | --- | --- |
| Example 6 | 14.1 | 11.2 | 0.79 | 3.35 |
| Example 7 | 14.0 | 9.7 | 0.69 | 3.18 |
| Example 8 | 13.9 | 9.5 | 0.68 | 3.2 |
| Example 9 | 14.3 | 8.89 | 0.62 | 2.43 |
| Example 10 | 13.5 | 9.2 | 0.68 | 3.15 |

As a result of the thermal annealing process or the UV curing process of removing porogen groups from molecules of the preliminary dielectric layer, the dielectric layers of Examples 6 to 10 were formed to have high porosities and low dielectric constants, as shown in TABLE 1. In particular, the dielectric layer of Example 6 had the lowest dielectric constant and the highest mechanical strength. Since the silicon precursor of Example 1 had a molecular structure containing a bridge carbon (—CH$_2$—) and four alkoxy groups, the dielectric layer of Example 6 was formed to have a relatively large amount of Si—O network structures. As a result, the dielectric layer of Example 6 had the high mechanical strength as described above. Furthermore, the dielectric layer of Example 6 was formed to have a relatively high content of Si—CH$_3$ bonding unit, and thus, it had a relatively large amount of the Si—O cage structures. As a result, the dielectric layer of Example 6 had the low dielectric constant as described above.

According to example embodiments of the inventive concepts, the dielectric layers may be formed to have high contents of carbon and oxygen atoms. For example, during a deposition process of the preliminary dielectric layer, many Si—CH$_3$ bonding units may be formed in the preliminary dielectric layer. The Si—O network structure consisting of Si—O bonding units may be broken by the Si—CH$_3$ bonding units, and thus, a nano-void may be formed in the structure. In other words, the Si—O cage structures may be formed as a result of breakage of the Si—O network structure, which may be caused by the Si—CH$_3$ bonding units.

Furthermore, the dielectric layers according to example embodiments of the inventive concepts had a relatively high ratio of Si—CH$_3$ bonding unit to Si—O bonding unit. The higher the ratio of Si—CH$_3$ bonding unit to Si—O bonding unit, the higher the number of the Si—CH$_3$ bonds in each of the dielectric layers. This may make it possible to suppress occurrence of plasma damage, in a process of forming interconnection lines in the dielectric layer. That is, it is possible to suppress plasma-induced damage.

The silicon precursor according to example embodiments of the inventive concepts may have a molecular structure containing a porogen group, and this may make it possible to form many Si—O cage structures in a dielectric layer. Accordingly, in the case where the silicon precursor is used to form a dielectric layer, it is possible to form a porous dielectric layer, without an additional step of supplying a pore-generating material. In addition, the silicon precursor according to example embodiments of the inventive concepts may have a molecular structure containing bridge carbon bonds (—(CH$_2$)$_n$—) and may contain alkoxy groups, instead of a plurality of alkyl groups, and thus, the silicon precursor can have improved thermal stability.

As a result, in the case where the silicon precursor according to example embodiments of the inventive concepts are used to form a dielectric layer, the dielectric layer can be formed to have a relatively low dielectric constant and a high mechanical strength that is applicable to an interconnection structure.

Example 11: Preparation of 1-((bicycloheptenyl)methylmethoxysilyl)-2-(trimethoxysilyl)methane Step 1. Preparation of 1-(methylchlorosilyl)-2-(trichlorosilyl)methane Magnesium (Mg) (34.37 g, 1.41 mol, 1.3 equivalent) and THF 100 mL were added into a flame-dried 5000 mL Schlenk flask and were heated up to 60° C. A mixed solution of (chloromethyl)trichlorosilane (200 g, 1.09 mol, 1.0 equivalent) and dichloromethylsilane (187.63 g, 1.63 mol, 1.5 equivalent) was slowly added into the reaction solution. The reaction solution was stirred at 60° C. for 10 hours, was filtered, and then, was worked up with n-pentane (1500 mL) four times. The solution was decompressed for removal of solvent and was purified (at 38° C. and 0.8 Torr) to obtain colorless liquid of Cl$_3$Si—CH$_2$—SiMeCl(H) (99.20 g, yield: 40%).

$_1$H-NMR (C$_6$D$_6$) δ 0.12 (3H), 0.41-0.58 (2H), 4.78 (1H).

Step 2. Preparation of 1-(methoxy(methyl)chlorosilyl)-2-(trimethoxysilyl)methane The 1-(methylchlorosilyl)-2-(trichlorosilyl)methane (99.20 g, 0.44 mol, 1.0 equivalent) prepared in Step 1 and n-pentane (2000 mL) were added in a flame-dried 5000 mL Schlenk flask, and triethylamine (220.07 g, 2.18 mol, 5.0 equivalent) and methanol (69.85 g, 2.18 mol, 5.0 equivalent) were slowly added into the reaction solution while maintaining the temperature at 0° C. The reaction solution was heated up to the room temperature (20° C.) and was stirred for 5 hours. The reaction solution was filtered, was decompressed for removal of solvent, and was purified at 30° C. and 0.46 Torr to obtain colorless liquid of (MeO)$_3$Si—CH$_2$—SiMe(OMe)(H) (82.38 g, yield: 89%).

$_1$H-NMR (C$_6$D$_6$) δ 0.05-0.09 (2H), 0.31 (3H), 3.33-3.42 (12H), 4.96 (1H).

Step 3. Preparation of 1-((bicycloheptenyl)methoxymethylsilyl)-2-(trimethoxysilyl)methane The 1-(methoxy(methyl)chlorosilyl)-2-(trimethoxysilyl)methane (82.38 g, 0.39 mol, 1.0 equivalent) prepared in Step 2 and dichloro(1, 5-cyclooctadiene)platinum(II) serving as catalyst were added in a flame-dried 1000 mL Schlenk flask. The reaction solution was heated up to 60° C. and was slowly added with norbornadiene (36.07 g, 0.39 mol, 1.0 equivalent). The reaction solution was stirred at 60° C. for 5 hours and was purified at 64° C. and 0.52 Torr to obtain colorless liquid compound (88.85 g, yield: 75%) represented by the following Chemical Formula.

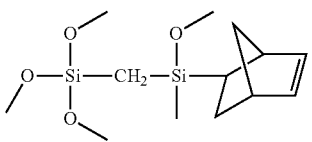 [SMILES: CO[Si](C[Si](C)(OC)C1CC2C=CC1C2)(OC)OC]

$_1$H-NMR (C$_6$D$_6$) δ −0.01 (exo, endo, 2H), 0.22-0.31 (exo, endo, 3H), 3.36-3.47 (exo, endo, 9H), 1.06-1.92, 2.78-2.98, 5.92-5.97 (bicycloheptenyl, 9H).

Example 12: Preparation of 1-((bicycloheptenyl)methylmethoxysilyl)-2-(trimethoxysilyl)ethane Step 1. Preparation of 1-(trichlorosilyl)-2-(methyldichlorosilyl)ethane Trichlorovinylsilane (200 g, 1.24 mol, 1.0 equivalent) and hexachloroplatinum(H$_2$Cl$_6$Pt6H$_2$O) serving as catalyst were added into a flame-dried 3000 mL Schlenk flask, and then, the reaction solution was heated up to 60° C. Dichloromethylsilane (156.7 g, 1.36 mol, 1.1 equivalent) was slowly added in the reaction solution. The mixed solution was refluxed for 8 hours to obtain MeCl$_2$Si—CH$_2$CH$_2$—SiCl$_3$ (384.81 g, yield: 98%).

$_1$H-NMR (C$_6$D$_6$) δ 0.21 (3H), 0.86 (2H), 1.06 (2H).

Step 2. Preparation of 1-(bis(dimethylamino)chlorosilyl)-2-(bis(dimethylamino)methylsilyl)ethane The 1-(trichlorosilyl)-2-(methyldichlorosilyl)ethane (384.81 g, 1.39 mol, 1.0 equivalent) prepared in Step 1 and n-pentane 3000 mL were added into a flame-dried 5000 mL Schlenk flask, and dimethylamine (501.87 g, 11.13 mol, 8.0 equivalent) was slowly added into the flask while maintaining the temperature at 0° C. The reaction solution was heated up to the room temperature (20° C.) and was stirred for 3 hours. The reaction solution was filtered, was decompressed for removal of solvent, and was purified to obtain colorless liquid of Me(NMe$_2$)$_2$Si—CH$_2$CH$_2$—Si(NMe$_2$)$_2$Cl (357.88 g, yield: 85%).

$_1$H-NMR (C$_6$D$_6$) δ 0.07 (3H), 0.78-0.91 (4H), 2.45 (24H).

Step 3. Preparation of 1-(bis(dimethylamino)silyl)-2-(bis(dimethylamino)methylsilyl)ethane LiAlH$_4$ (15.71 g, 0.41 mol, 0.35 equivalent) was added into a flame-dried 2000 mL Schlenk flask, and then, THF (500 mL) was slowly added into the flask while maintaining the temperature at −30° C. The 1-(bis(dimethylamino)chlorosilyl)-2-(bis(dimethylamino)methylsilyl)ethane (357.88 g, 1.18 mol, 1.0 equivalent) prepared in Step 2 was slowly added in the flask while maintaining the temperature at −30° C. The reaction solution was heated up to the room temperature (20° C.) and was stirred for 5 hours. The reaction solution was filtered, was decompressed for removal of solvent, and was purified at 73° C. and 1.66 Torr to obtain colorless liquid of Me(NMe$_2$)$_2$Si—CH$_2$CH$_2$—Si(NMe$_2$)$_2$H (245.36 g, yield: 75%).

$_1$H-NMR (C$_6$D$_6$) δ 0.10 (3H), 0.69 (4H), 2.47 (12H), 2.52 (12H), 4.59 (1H).

Step 4. Preparation of 1-(diethoxysilyl)-2-(diethoxy(methyl)silyl)ethane

The 1-(bis(dimethylamino)silyl)-2-(bis(dimethylamino)methylsilyl)ethane (245.36 g, 0.89 mol, 1.0 equivalent) prepared in Step 3 and n-pentane (1000 mL) were added into a flame-dried 3000 mL Schlenk flask, and the, methanol (113.7 g, 3.55 mol, 4.0 equivalent) was slowly added into the flask while maintaining the temperature at 0° C. The reaction solution was heated up to the room temperature (20° C.) and was stirred for 5 hours. The reaction solution was filtered, was decompressed for removal of solvent, and then, colorless liquid of Me(MeO)$_2$Si—CH$_2$CH$_2$—Si(OMe)$_2$H (104.16 g, yield: 87%) was obtained.

$^1$H-NMR (C$_6$D$_6$) δ 0.08 (3H), 0.80 (4H), 3.48-3.68 (12H), 4.78 (1H).

Step 5. Preparation of 1-((2-cycloheptenyl)dimethoxysilyl)-2-(methyldimethoxysilyl)ethane The 1-(dimethoxysilyl)-2-(dimethoxy(methyl)silyl)ethane (104.16 g, 0.46 mol, 1.0 equivalent) prepared in Step 4, along with dichloro(1, 5-cyclooctadiene)platinum(II) serving as catalyst, were added into a flame-dried 1000 mL Schlenk flask. The reaction solution was heated up to 60° C. and was slowly added with norbornadiene (42.77 g, 0.46 mol, 1.0 equivalent). The mixed solution was stirred at 60° C. for 5 hours and was purified at 88° C. and 0.18 Torr to obtain colorless liquid compound (104.84 g, yield: 72%) represented by the following Chemical Formula.

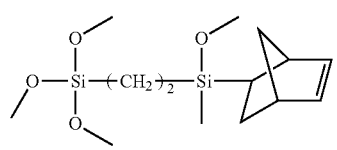

$_1$H-NMR (C$_6$D$_6$) δ 0.08 (3H), 0.85-0.92 (4H), 3.66-3.75 (12H), 0.52-3.12, 5.88-6.10 (bicycloheptenyl, 9H).

Example 13: Preparation of 1-((bicycloheptenyl)dimethoxysilyl)-2-(methyldimethoxysilyl)methane Step 1. Preparation of 1-(trichlorosilyl)-2-(methyldichlorosilyl)methane Acetonitrile (1500 mL) and (chloromethyl)dichloromethylsilane (500 g, 3.06 mol, 1.0 equivalent) were added into a flame-dried 5000 mL Schlenk flask and heated up to 70° C. Triethylamine (340.37 g, 3.36 mol, 1.1 equivalent) was added into the reaction solution, and then, trichlorosilane (455.61 g, 3.36 mol, 1.1 equivalent) was slowly added into the flask while maintaining the temperature at 70° C. The reaction solution was stirred at 70° C. for 5 hours, was filtered, and then, was worked up with n-pentane (1500 mL) four times. The solution was decompressed for removal of solvent and was purified (at 28° C. and 1.01 Torr) to obtain colorless liquid of MeCl$_2$Si—CH$_2$—SiCl$_3$ (160.54 g, yield: 20%).

$_1$H-NMR (C$_6$D$_6$) δ 0.38 (3H), 0.69 (2H).

Step 2. Preparation of 1-(bis(dimethylamino)chlorosilyl)-2-(bis(dimethylamino)methylsilyl)methane The 1-(trichlorosilyl)-2-(methyldichlorosilyl)methane (160.54 g, 0.61 mol, 1.0 equivalent) prepared in Step 1 and n-pentane (3000 mL) were added into a flame-dried 5000 mL Schlenk flask, and diethylamine (330.84 g, 7.34 mol, 12.0 equivalent) was slowly added into the flask while maintaining the temperature at 0° C. The reaction solution was heated up to the room temperature (20° C.) and was stirred for 3 hours. The reaction solution was filtered, was decompressed for removal of solvent, and was purified at 78° C. and 0.8 Torr to obtain colorless liquid of Me(NMe$_2$)$_2$Si—CH$_2$—Si(NMe$_2$)$_2$Cl (163.48 g, yield: 90%).

$_1$H-NMR (C$_6$D$_6$) δ 0.18 (3H), 0.30 (2H), 2.43-2.47 (24H).

Step 3. Preparation of 1-(bis(dimethylamino)silyl)-2-(bis(dimethylamino)methylsilyl)methane LiAlH$_4$ (7.31 g, 0.19 mol, 0.35 equivalent) was added into a flame-dried 1000 mL Schlenk flask, and then, THF (300 mL) was slowly added into the flask while maintaining the temperature at −30° C. The 1-(bis(dimethylamino)chlorosilyl)-2-(bis(dimethylamino)methylsilyl)methane (163.48 g, 0.55 mol, 1.0 equivalent) prepared in Step 2 was slowly added in the flask while maintaining the temperature at −30° C. The reaction solution was heated up to the room temperature (20° C.) and was stirred for 5 hours. The reaction solution was filtered, was decompressed for removal of solvent, and was purified at 56° C. and 0.5 Torr to obtain colorless liquid of Me(NMe$_2$)$_2$Si—CH$_2$—Si(NMe$_2$)$_2$H (108.38 g, yield: 75%).

$_1$H-NMR (C$_6$D$_6$) δ 0.04 (2H), 0.16 (3H), 2.44-2.48 (24H), 4.48 (1H).

Step 4. Preparation of 1-(dimethoxysilyl)-2-(dimethoxy(methyl)silyl)methane

The 1-(bis(dimethylamino)silyl)-2-(bis(dimethylamino)methylsilyl)methane (108.38 g, 0.41 mol, 1.0 equivalent) prepared in Step 3 and n-pentane (1000 mL) were added into a flame-dried 3000 mL Schlenk flask, and then, methanol (52.87 g, 1.65 mol, 4.0 equivalent) was slowly added into the flask while maintaining the temperature at 0° C. The reaction solution was heated up to the room temperature (20° C.) and was stirred for 5 hours. The reaction solution was filtered, was decompressed for removal of solvent, and was purified at 46° C. and 0.48 Torr to obtain colorless liquid of Me(MeO)$_2$Si—CH$_2$—Si(OMe)$_2$H (78.49 g, yield: 91%).

$_1$H-NMR (C$_6$D$_6$) δ 0.07 (2H), 0.21 (3H), 3.35-3.38 (9H), 4.82 (1H).

Step 5. Preparation of 1-((bicycloheptenyl)dimethoxysilyl)-2-(methyldimethoxysilyl)methane The 1-(dimethoxysilyl)-2-(dimethoxy(methyl)silyl)methane (78.49 g, 0.37 mol, 1.0 equivalent) prepared in Step 4 and dichloro(1, 5-cyclooctadiene)platinum(II) serving as catalyst were into a flame-dried 1000 mL Schlenk flask. The reaction solution was heated up to 60° C., and then, norbornadiene (34.38 g, 0.37 mol, 1.0 equivalent) was slowly added into the reaction solution. The reaction solution was stirred at 60° C. for 5 hours and was purified at 93° C. and 0.56 Torr to obtain colorless liquid compound (87.30 g, yield: 78%) represent by the following Chemical Formula.

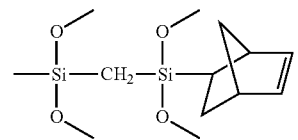

$_1$H-NMR (C$_6$D$_6$) δ −0.04 (exo, endo, 2H), 0.25-0.27 (exo, endo, 3H), 3.34-3.40 (exo, endo, 9H), 0.61-1.89, 2.78-3.08, 5.95-6.16 (bicycloheptenyl, 9H).

Experimental Example 1

Figure 9:
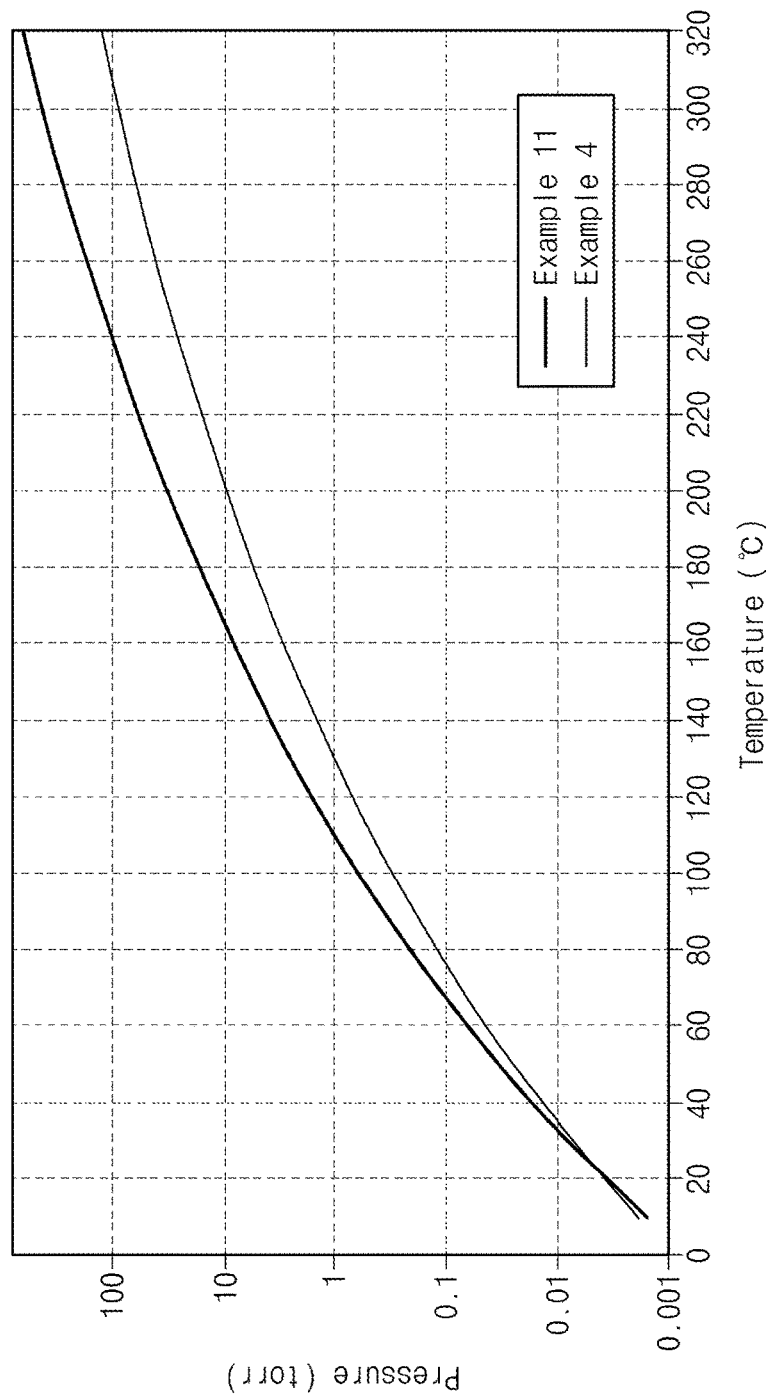
FIG. 9 is a graph showing a vapor pressure of a silicon precursor according to example embodiments of the inventive concepts.

FIG. 9 shows measured vapor pressures of the compounds respectively prepared in Examples 4 and 11.

As shown in FIG. 9, the vapor pressure of the compound of Example 11 (i.e., containing a molecule, in which alkoxy group was the methoxy group) was higher than that of Example 4 (i.e., containing a molecule, in which alkoxy group was the ethoxy group). In other words, in the case where the methoxy group was used as the alkoxy group in a silicon precursor, the resulting compound had a relatively high vapor pressure, allowing it to be more stable in a process of depositing a dielectric layer.

Examples 14 to 16: Dielectric Layers Formed Using Silicon Precursor of Example 11

The dielectric layers of Examples 14 to 16 were formed by substantially the same method as that described with reference to Examples 6 to 10, except for the compound prepared in Example 11 was used as the silicon precursor for the dielectric layers. The thermal annealing process, as the energy treatment, was performed for 2 hours. In Examples 14 to 16, the thermal annealing process was performed at different temperatures. In Examples 14 to 16, the process temperatures were 500° C., 550° C., and 600° C., respectively.

In the dielectric layer of Example 14, the ratio of Si—O cage to Si—O network was 0.61. In addition, the dielectric layer of Example 14 had a dielectric constant of 2.46 and a Young's modulus of 6.87 GPa.

In the dielectric layer of Example 15, the ratio of Si—O cage to Si—O network was 0.65. In addition, the dielectric layer of Example 15 had a dielectric constant of 2.25 and a Young's modulus of 11.2 GPa.

In the dielectric layer of Example 16, the ratio of Si—O cage to Si—O network was 0.75. In addition, the dielectric layer of Example 16 had a dielectric constant of 2.3 and a Young's modulus of 12.5 GPa.

In the molecular structure of the silicon precursor of Example 11, the alkoxy group may be a methoxy group. According to the results of Examples 14 to 16, in the case where the silicon precursor containing the methoxy group is used to form a dielectric layer, an increase of a process temperature of the thermal annealing process led to an increase in the ratio of Si—O cage to Si—O network in the dielectric layer. In particular, when the thermal annealing process was performed at a temperature of 550° C. (Example 15), the dielectric layer had the lowest dielectric constant and an improved mechanical strength.

Experimental Example 2

The following TABLE 2 provides comparison between the dielectric layer of Example 9 (i.e., formed using the silicon precursor of Example 4) and the dielectric layer of Example 15. When compared with the silicon precursor of Example 4, the silicon precursor of Example 11 contains a methoxy group, instead of the ethoxy group. The following TABLE 3 shows carbon, oxygen, and silicon contents of the dielectric layers of Examples 9 and 11 measured by an XPS system.

TABLE 3

| Precursor | C 1s | O 1s | Si 2P |
|---|---|---|---|
| 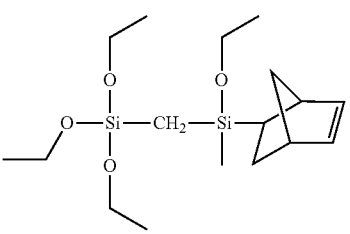 (Example 4) | 25.4 | 42.80 | 31.70 |
| 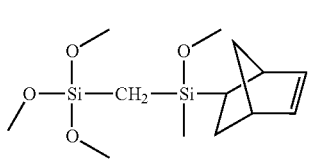 (Example 11) | 29.5 | 40.30 | 30.20 |

Referring to TABLE 2, in the case where the silicon precursor example (i.e., containing the methoxy group) was used to form a dielectric layer, the dielectric layer was formed to have a high ratio of Si—O cage to Si—O network, compared with that in the case of the silicon precursor of Example 4 (i.e., containing the ethoxy group). Since, as described above, a nano-void is formed in the Si—O cage structure, the increase of the Si—O cage structure may make it possible to reduce a dielectric constant of a dielectric layer.

The silicon precursor of Example 11 (i.e., containing the methoxy group) had a lower carbon content than that of the silicon precursor of Example 4 (i.e., containing the ethoxy group). However, as shown in TABLE 3, the dielectric layer of Example 15 formed using the silicon precursor of Example 11 had a higher carbon content than that of the dielectric layer of Example 9 formed using the silicon precursor of Example 4. That is, the dielectric layer of

TABLE 2

| Precursor | Si-O Network | Si-O cage | Si-O cage / Si-O Network | dielectric constant | Young's modulus (GPa) |
|---|---|---|---|---|---|
| 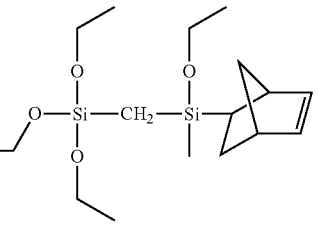 (Example 4) | 14.3 | 8.89 | 0.62 | 2.35 | 9.86 |
| 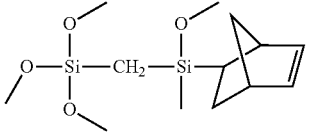 (Example 11) | 13.16 | 8.6 | 0.65 | 2.25 | 11.2 |

Example 15 was formed to have a lower dielectric constant and a higher mechanical strength than those of the dielectric layer of Example 9.

Examples 17 to 19: Formation of Dielectric Layer Using Silicon Precursor of Example 13

A substrate was disposed in a PE-CVD chamber. A temperature of the substrate was heated up to 250° C. and was maintained at 250° C. until a deposition process was finished. A silicon precursor was supplied into the chamber at a flow rate of 475 cc/min, along with a carrier gas (e.g., 400 sccm argon gas), and here, the compound prepared in Example 13 was used as the silicon precursor. Also, oxygen gas serving as a reaction gas (e.g., oxidizing agent) was supplied into the chamber. A flow rate of the oxygen gas was 30 cc/min. RF power of 13.56 MHz and 50 W was applied to an upper electrode of the chamber. An internal pressure of the chamber was adjusted to 1 Torr. In the chamber, a preliminary dielectric layer was deposited on the substrate. A thermal annealing process ($N_2$, 15SLM) was performed at a temperature of 550° C. for 2 hours on the substrate provided with the preliminary dielectric layer. As a result, a porous dielectric layer of Example 17 was formed on the substrate.

In the case of a porous dielectric layer of Example 18, the preliminary dielectric layer was deposited at a substrate temperature of 180° C., the flow rate of the reaction (i.e., oxygen) gas oxygen was 25 cc/min, and the internal pressure of the chamber was 1.5 Torr. Except for these differences, the porous dielectric layer of Example 18 was formed using the same method as that in Example 17.

In the case of a porous dielectric layer of Example 19, the flow rate of the reaction (i.e., oxygen) gas oxygen was 25 cc/min and the internal pressure of the chamber was 1.5 Torr. Except for these differences, the porous dielectric layer of Example 19 was formed using the same method as that in Example 17.

In the case of a porous dielectric layer of Example 19, the preliminary dielectric layer was deposited at a substrate temperature of 200° C., the flow rate of the reaction (i.e., oxygen) gas oxygen was 25 cc/min, and the energy treatment was performed in such a way that the substrate temperature was heated up to 400° C. and then a UV curing process was performed for 10 minute. Except for these differences, the porous dielectric layer of Example 20 was formed using the same method as that in Example 17.

In the dielectric layer of Example 17, a ratio of Si—O cage to Si—O network was 0.75. Furthermore, the dielectric layer of Example 17 had a dielectric constant of 2.3 and a Young's modulus of 11.0 GPa.

In the dielectric layer of Example 18, a ratio of Si—O cage to Si—O network was 0.8. Furthermore, the dielectric layer of Example 18 had a dielectric constant of 2.4 and a Young's modulus of 15 GPa.

In the dielectric layer of Example 19, a ratio of Si—O cage to Si—O network was 0.82. Furthermore, the dielectric layer of Example 19 had a dielectric constant of 2.4 and a Young's modulus of 14 GPa.

In the dielectric layer of Example 20, a ratio of Si—O cage to Si—O network was 0.85. Furthermore, the dielectric layer of Example 20 had a dielectric constant of 2.2 and a Young's modulus of 12.3 GPa.

Figure 3:
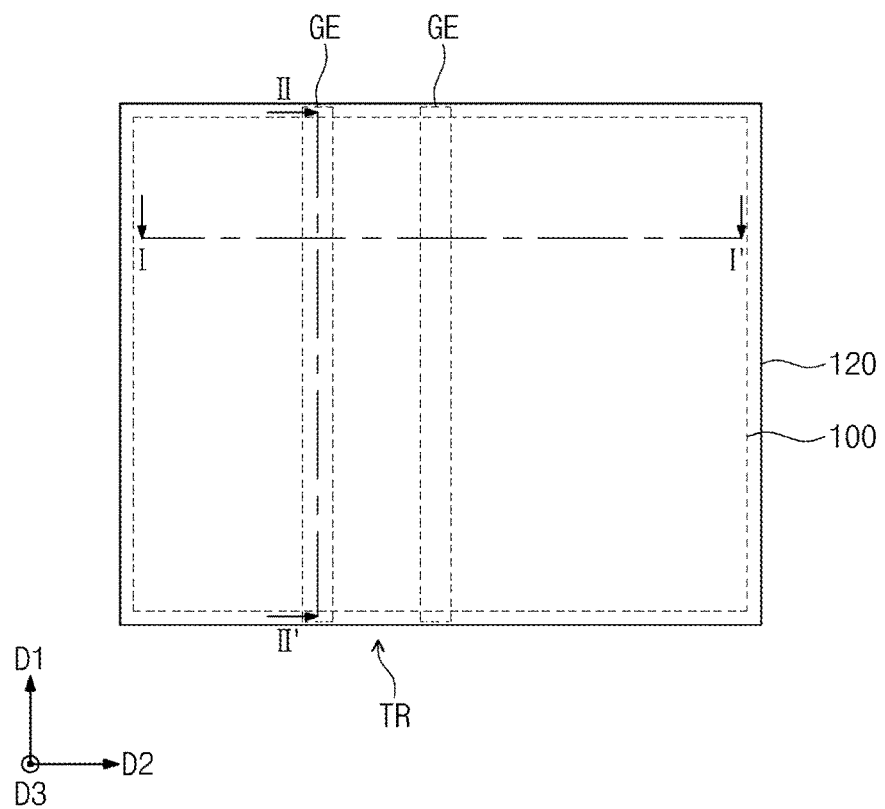
FIGS. 3, 5, and 7 are plan views illustrating a method of fabricating a semiconductor device, according to example embodiments of the inventive concepts.
Figure 4A:
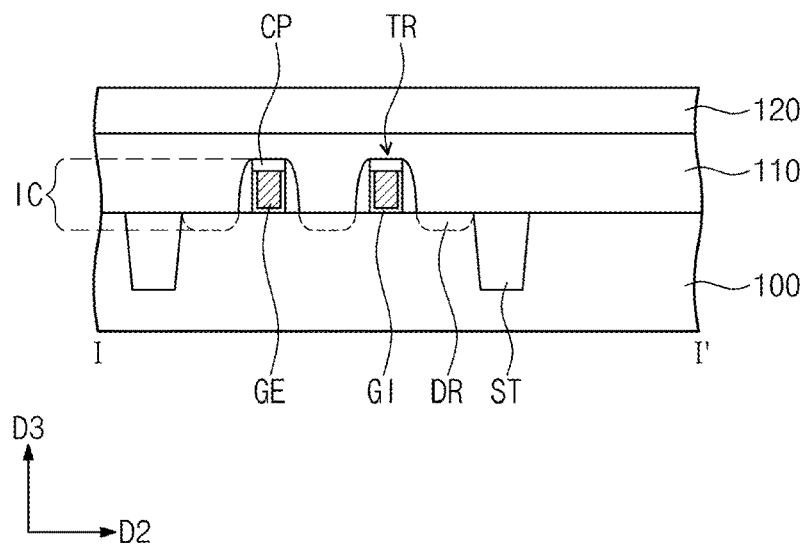
FIGS. 4A, 6A, and 8A are sectional views taken along line I-I' of FIGS. 3, 5, and 7, respectively.
Figure 4B:
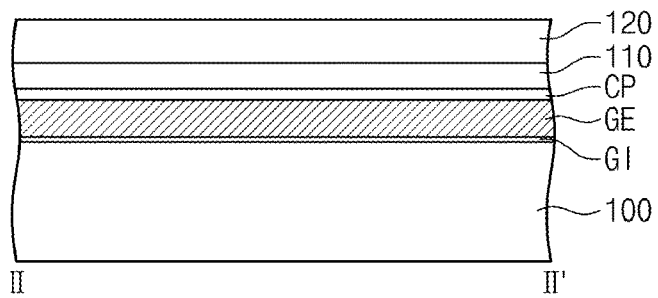
FIGS. 4B, 6B, and 8B are sectional views taken along line II-II' of FIGS. 3, 5, and 7, respectively.
Figure 4B:
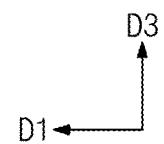
Figure 5:
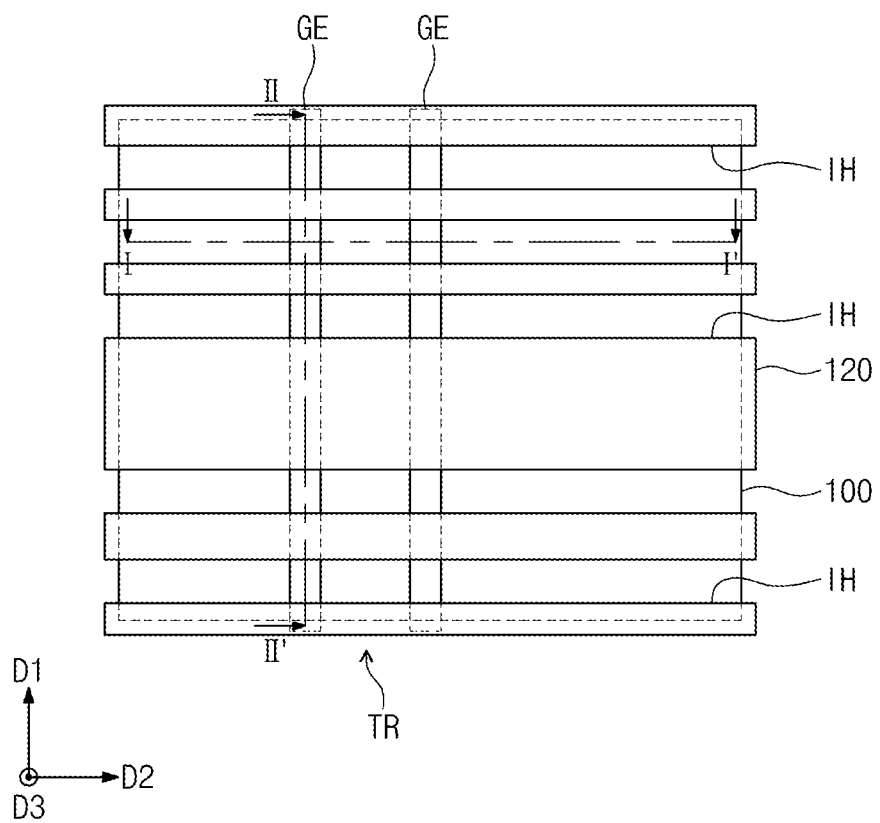
Figure 6A:
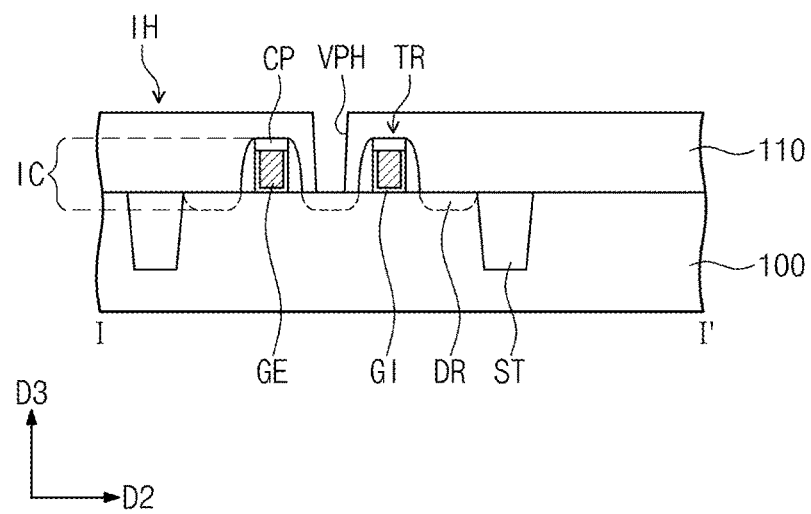
Figure 6B:
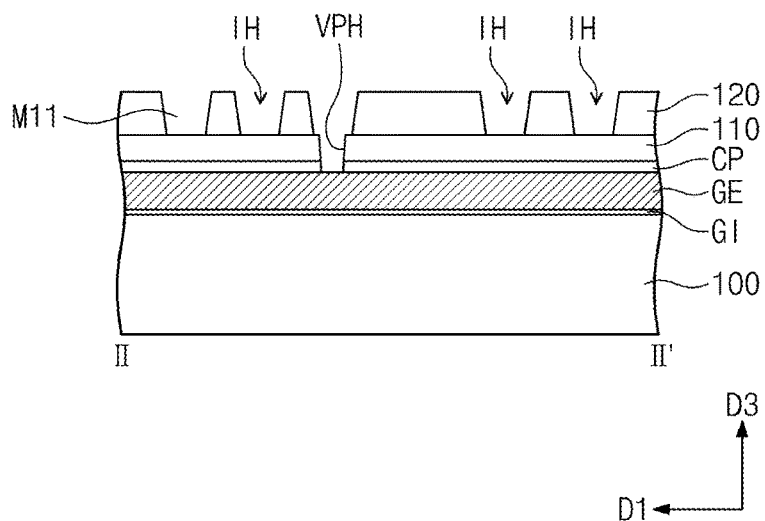
Figure 7:
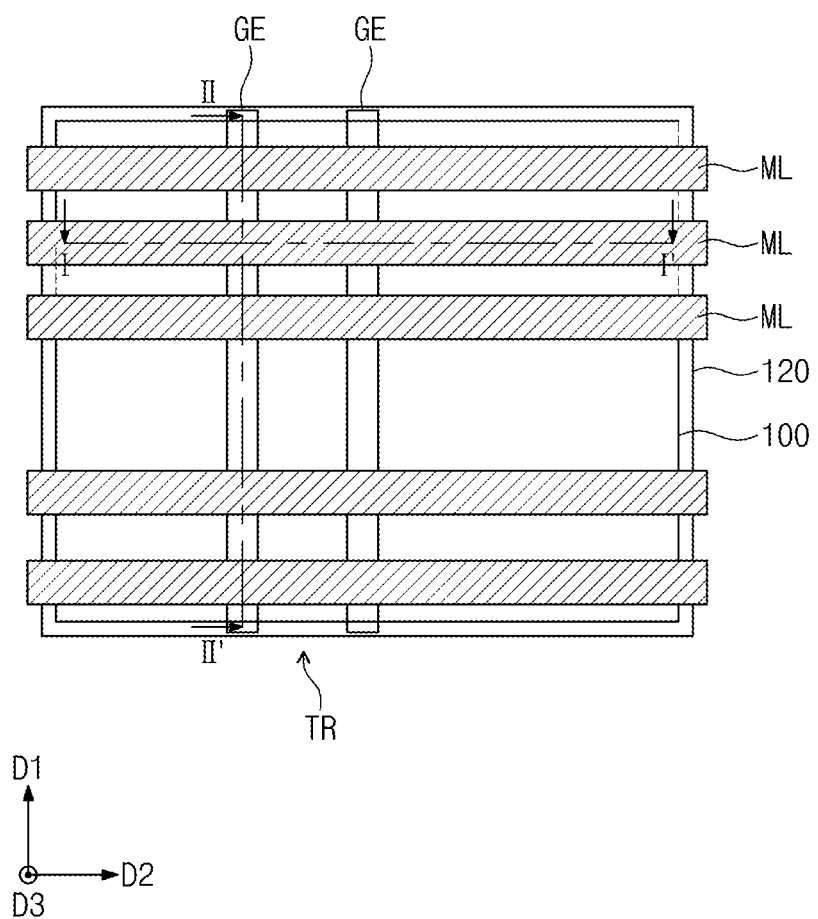
Figure 8A:
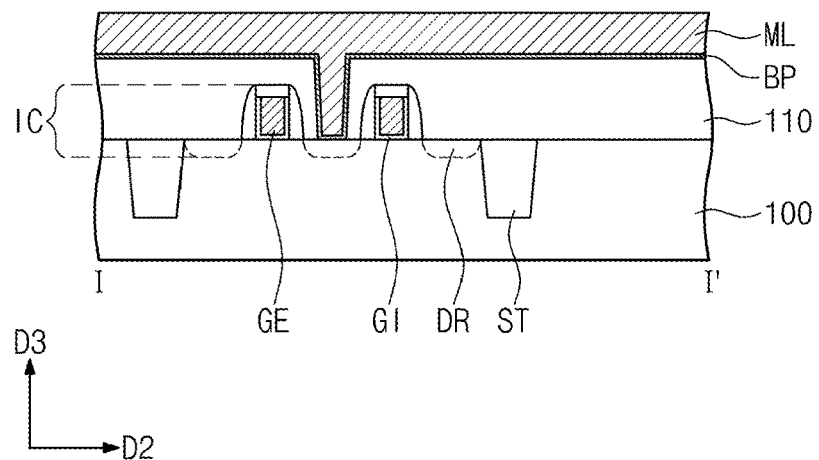
Figure 8B:
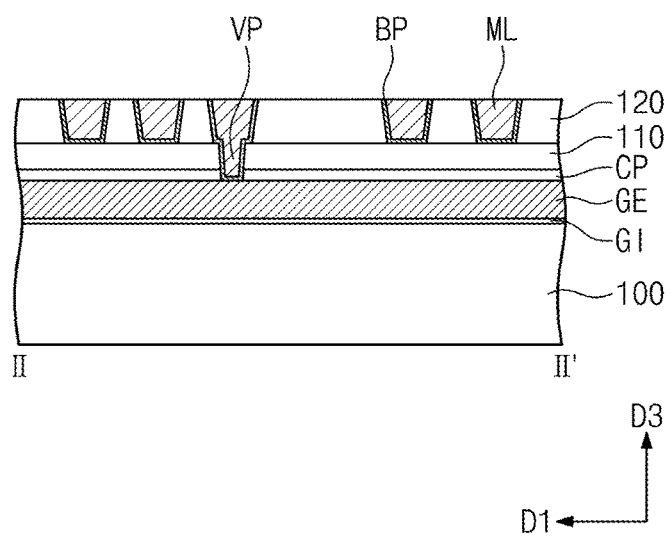

FIGS. 3, 5, and 7 are plan views illustrating a method of fabricating a semiconductor device, according to example embodiments of the inventive concepts. FIGS. 4A, 6A, and 8A are sectional views taken along line I-I' of FIGS. 3, 5, and 7, respectively, and FIGS. 4B, 6B, and 8B are sectional views taken along line II-II' of FIGS. 3, 5, and 7, respectively.

Referring to FIGS. 3, 4A, and 4B, an integrated circuit IC may be formed on a substrate 100. The substrate 100 may be a semiconductor substrate that is formed of at least one of silicon, germanium, silicon-germanium, or compound semiconductor materials.

The integrated circuit IC may include a plurality of transistors TR. The formation of the transistors TR may include forming device isolation layers ST defining an active region and forming a gate dielectric layer GI, a gate electrode GE, and a capping pattern CP on the active region. The gate electrode GE may be formed on the active region, the gate dielectric layer GI may be provided between the gate electrode GE and the substrate 100, and the capping pattern CP may be formed to cover a top surface of the gate electrode GE. Impurity regions DR may be formed at both sides of the gate electrode GE. For example, the impurity regions DR may be formed by doping the substrate 100 with impurities.

Thereafter, a first insulating layer 110 and a second insulating layer 120 may be formed on the substrate 100 to cover the transistors TR. The second insulating layer 120 may be formed to directly cover the first insulating layer 110. The second insulating layer 120 may be or include a low-k dielectric layer formed using the method described with reference to FIGS. 1A and 2. For example, the second insulating layer 120 may be a porous SiOCH layer. The first insulating layer 110 may also be a porous SiOCH layer formed using the method described with reference to FIGS. 1A and 2. In example embodiments, the first insulating layer 110 may be formed of or include a silicon oxide layer, which may be formed using other known silicon precursor.

Referring to FIGS. 5, 6A, and 6B, the second insulating layer 120 may be patterned to form interconnection holes IH, and here, each of the interconnection holes IH may have a shape elongated in a second direction D2. At least one of the interconnection holes IH may include a vertical penetration hole VPH extending in a direction toward the substrate 100. For example, a portion of the first insulating layer 110 may be patterned by the process of patterning the second insulating layer 120. As an example, the vertical penetration hole VPH may be formed to penetrate the first insulating layer 110 and to expose a portion of the impurity region DR. As another example, the vertical penetration hole VPH may be formed to penetrate the first insulating layer 110 and to expose a portion of a top surface of the gate electrode GE.

According to example embodiments of the inventive concepts, the second insulating layer 120 may have a relatively high mechanical strength. This may make it possible to suppress or prevent the second insulating layer 120 from collapsing or to maintain an original structure of the second insulating layer 120 in the patterning process for forming the interconnection holes IH to a high pattern density.

Referring to FIGS. 7, 8A, and 8B, interconnection lines ML may be formed to fill the interconnection holes IH, respectively. For example, the formation of the interconnection lines ML may include forming a barrier layer on the substrate 100. The barrier layer may be formed to conformally cover the interconnection holes IH. The barrier layer may be formed of or include at least one of Ti or TiN.

Next, a conductive layer may be formed on the substrate 100. The conductive layer may be formed to fill the interconnection holes IH provided with the barrier layer. The conductive layer may be formed of or include at least one of metallic materials (e.g., copper (Cu) or tungsten (W)). For example, the conductive layer may be formed by a plating process. In example embodiments, the formation of the conductive layer may include forming a seed layer (not shown) on the barrier layer and then performing a plating process using the seed layer.

The conductive layer and the barrier layer may be planarized to form the interconnection lines ML and the barrier patterns BP in each of the interconnection holes IH. In example embodiments, the interconnection lines ML may be formed to have top surfaces coplanar with that of the second insulating layer 120.

In the case where a pattern density of the interconnection lines ML is relatively high, the semiconductor device may suffer from high parasitic capacitance between the interconnection lines ML. The higher the parasitic capacitance between the interconnection lines ML, the worse the RC delay property of the semiconductor device. However, in the case where a porous layer with a low dielectric constant is used as the second insulating layer 120 as described above, it is possible to effectively reduce the parasitic capacitance between the interconnection lines ML.

Although not shown, insulating and interconnection layers may be further stacked on the second insulating layer 120.

According to example embodiments of the inventive concepts, a method of forming a low-k dielectric layer using a silicon precursor is disclosed. The use of this method may allow a dielectric layer to have a low dielectric constant and a high mechanical strength. The novel silicon precursor may have improved thermal stability and may make it possible to form a dielectric layer with many pores. In the case where the low-k dielectric layer is used to cover interconnection lines, it is possible to robustly support the interconnection lines, due to its high mechanical strength, and reduce an electric capacitance between the interconnection lines, due to its low dielectric constant.

While example embodiments of the inventive concepts have been particularly shown and described, it will be understood by one of ordinary skill in the art that variations in form and detail may be made therein without departing from the spirit and scope of the attached claims.

What is claimed is:
1. A method of forming a dielectric layer, comprising:
   forming a preliminary dielectric layer on a substrate using a silicon precursor containing a compound represented by the following Chemical Formula 1; and
   performing an energy treatment on the preliminary dielectric layer to form the dielectric layer,

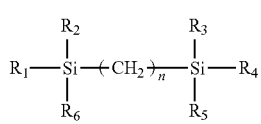

[Chemical Formula 1]

wherein, in the Chemical Formula 1,
n is 1 or 2,
at least two of $R_1$, $R_2$, $R_3$, $R_5$, and $R_6$ are —O—$R_7$ and others of $R_1$, $R_2$, $R_3$, $R_5$, and $R_6$ are each independently one of hydrogen, $(C_1$-$C_{10})$alkyl, $(C_3$-$C_{10})$alkenyl, $(C_3$-$C_{10})$alkynyl, and $(C_1$-$C_{10})$alkoxy,
$R_7$ is one of hydrogen, $(C_1$-$C_{10})$alkyl, $(C_3$-$C_{10})$alkenyl, and $(C_3$-$C_{10})$alkynyl, and $R_4$ is a porogen group including one of $(C_3$-$C_{10})$alkenyl, $(C_3$-$C_{10})$alkynyl, $(C_3$-$C_{10})$aryl, $(C_3$-$C_{10})$heteroaryl, $(C_3$-$C_{10})$cycloalkyl, $(C_3$-$C_{10})$cycloalkenyl, $(C_3$-$C_{10})$cycloalkynyl, $(C_3$-$C_{10})$heterocycloalkyl, $(C_3$-$C_{10})$aryl $(C_1$-$C_{10})$alkyl, $(C_3$-$C_{10})$cycloalkyl$(C_1$-$C_{10})$alkyl, and $(C_3$-$C_{10})$heterocycloalkyl$(C_1$-$C_{10})$alkyl,
wherein a ratio of a Si—$CH_3$ bonding unit to a Si—O bonding unit ranges from 0.5 to 5, and
wherein the $(C_3$-$C_{10})$heteroaryl and the $(C_3$-$C_{10})$heterocycloalkyl of the $R_4$ each independently include at least one heteroatom including one of —$NR_8$—, —O—, and —S—, and $R_8$ is one of hydrogen and $(C_1$-$C_{10})$alkyl.

2. The method of claim 1, wherein at least two of $R_1$, $R_2$, $R_3$, $R_5$, and $R_6$ are $(C_1$-$C_5)$alkoxy, and others of $R_1$, $R_2$, $R_3$, $R_5$, and $R_6$ are $(C_1$-$C_5)$alkyl.

3. The method of claim 2, wherein at least three of $R_1$, $R_2$, $R_3$, $R_5$, and $R_6$ are methoxy, and others of $R_1$, $R_2$, $R_3$, $R_5$, and $R_6$ are $(C_1$-$C_5)$alkyl.

4. The method of claim 1, wherein the $R_4$ is one of 1-propenyl group, 2-propenyl group, 1-butenyl group, 2-butenyl group, 3-butenyl group, 1-methyl-2-propenyl group, 2-methyl-2-propenyl group, 1-pentenyl group, 2-pentenyl group, 3-pentenyl group, 4-pentenyl group, 1-methyl-2-butenyl group, 2-methyl-2-butenyl group, 1-hexenyl group, 2-hexenyl group, 3-hexenyl group, 4-hexenyl group, 5-hexenyl group, phenyl group, xylene group, cyclopropyl group, cyclobutyl group, cyclopentyl group, cyclohexyl group, cycloheptyl group, cyclooctyl group, cyclopentenyl group, cyclopentadiene group, cyclohexadiene group, cycloheptadiene group, bicycloheptyl group, bicycloheptenyl group, cyclohexene oxide group, cyclopentene oxide group, terpinene group, limonene group, butadieneoxide, styrene, and fulvene.

5. The method of claim 1, wherein a mean diameter of pores in the dielectric layer ranges from 0.5 nm to 5 nm.

6. The method of claim 1, wherein a total volume of pores in the dielectric layer ranges from 8% to 35% of a total volume of the dielectric layer.

7. The method of claim 1, wherein the dielectric layer has a Young's modulus of 6-15 GPa.

8. The method of claim 1, wherein a ratio of Si—O cage structures to Si—O network structures in the dielectric layer ranges from 0.5 to 1.

9. A method of fabricating a semiconductor device, the method comprising:
   forming a silicon insulating layer on a substrate using a silicon precursor, the silicon precursor including,
      a molecule having a structure of Si—$(CH_2)_n$—Si, wherein n is 1 or 2,
      a porogen group configured to combine with at least one of the Si atoms in the molecule, the porogen group including one of $(C_3$-$C_{10})$alkenyl, $(C_3$-$C_{10})$alkynyl, $(C_3$-$C_{10})$aryl, $(C_3$-$C_{10})$heteroaryl $(C_3$-$C_{10})$cycloalkyl, $(C_3$-$C_{10})$cycloalkenyl, $(C_3$-$C_{10})$cycloalkynyl, $(C_3$-$C_{10})$heterocycloalkyl, $(C_3$-$C_{10})$aryl $(C_1$-$C_{10})$alkyl, $(C_3$-$C_{10})$cycloalkyl$(C_1$-$C_{10})$alkyl, and $(C_3$-$C_{10})$heterocycloalkyl$(C_1$-$C_{10})$alkyl, and
      at least two $(C_1$-$C_5)$alkoxy groups configured to combine with the Si atoms in the molecule; and
   forming at least one interconnection line in the silicon insulating layer
   wherein the porogen group is a functional group directly bonded to the at least one of the Si atoms.

10. The method of claim 9, wherein a ratio of Si—$CH_3$ bonding unit to Si—O bonding unit in the silicon insulating layer ranges from 0.5 to 5.

11. The method of claim 9, wherein a ratio of Si—O cage structures to Si—O network structures in the silicon insulating layer ranges from 0.5 to 1.

12. The method of claim 9, wherein the forming at least one interconnection line comprises:
   patterning the silicon insulating layer to form at least one interconnection hole in the silicon insulating layer; and
   forming a conductive layer to fill the at least one interconnection hole.

13. The method of claim 12, wherein the forming at least one interconnection line further comprises forming a barrier layer to cover the at least one interconnection hole before the forming a conductive layer.

14. The method of claim 9, wherein
   the porogen group has a cyclic hydrocarbon structure, and
   the porogen group is one of cyclopropyl group, cyclobutyl group, cyclopentyl group, cyclohexyl group, cycloheptyl group, cyclooctyl group, cyclopentenyl group, cyclopentadiene group, cyclohexadiene group, cycloheptadiene group, bicycloheptyl group, bicycloheptenyl group, cyclohexene oxide group, cyclopentene oxide group, terpinene group, limonene group, butadieneoxide, styrene, and fulvene.

15. A method comprising:
   forming a dielectric layer using a silicon precursor containing a compound represented by the following Chemical Formula 1:

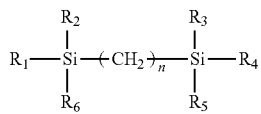

[Chemical Formula 1]

wherein, in the Chemical Formula 1,
n is 1 or 2,
at least three of $R_1$, $R_2$, $R_3$, $R_5$, and $R_6$ are methoxy and the others are each independently one of hydrogen, $(C_1$-$C_{10})$alkyl, $(C_3$-$C_{10})$alkenyl, $(C_3$-$C_{10})$alkynyl, and $(C_1$-$C_{10})$alkoxy, and $R_4$ is a porogen group directly bonded to the Si atom and including one of $(C_3$-$C_{10})$alkenyl, $(C_3$-$C_{10})$alkynyl, $(C_3$-$C_{10})$aryl, $(C_3$-$C_{10})$heteroaryl, $(C_3$-$C_{10})$cycloalkenyl, $(C_3$-$C_{10})$cycloalkynyl, $(C_3$-$C_{10})$heterocycloalkyl, $(C_3$-$C_{10})$aryl$(C_1$-$C_{10})$alkyl, $(C_3$-$C_{10})$cycloalkyl$(C_1$-$C_{10})$alkyl, and $(C_3$-$C_{10})$heterocycloalkyl$(C_1$-$C_{10})$alkyl.

16. The method of claim 15, wherein the forming a dielectric layer comprises:
   forming a preliminary dielectric layer on the substrate using the silicon precursor; and
   performing an energy treatment on the preliminary dielectric layer.

17. The method of claim 15, wherein a total volume of pores in the dielectric layer ranges from 8% to 35% of a total volume of the dielectric layer.

18. The method of claim 15, wherein a ratio of Si—O cage structures to Si—O network structures in the dielectric layer ranges from 0.5 to 1.

19. The method of claim 15, wherein, in the Chemical Formula 1, Si—R4 is one of

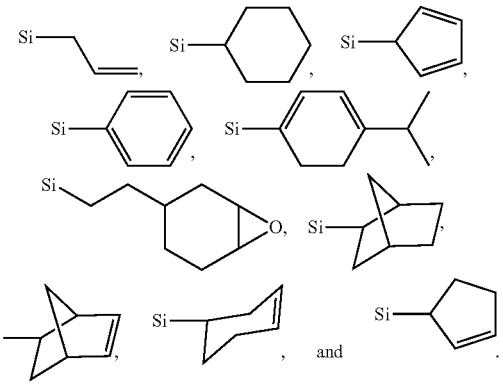

20. The method of claim 15, wherein the dielectric layer has a dielectric constant of 2.2-2.3.

* * * * *